(12) United States Patent
Koyama et al.

(10) Patent No.: US 6,990,128 B2
(45) Date of Patent: Jan. 24, 2006

(54) SURFACE EMITTING SEMICONDUCTOR LASER AND MANUFACTURING METHOD THEREOF

(75) Inventors: Fumio Koyama, Yokohama (JP); Nobuaki Ueki, Ebina (JP)

(73) Assignees: Fuji Xerox Co., Ltd., Tokyo (JP); Fumio Koyama, Yokohama (JP)

(*) Notice: Subject to any disclaimer, the term of this patent is extended or adjusted under 35 U.S.C. 154(b) by 67 days.

(21) Appl. No.: 10/026,637

(22) Filed: Dec. 27, 2001

(65) Prior Publication Data

US 2002/0141472 A1 Oct. 3, 2002

(30) Foreign Application Priority Data

Mar. 27, 2001 (JP) .......................... 2001-91351
Sep. 19, 2001 (JP) ....................... 2001-285964

(51) Int. Cl.
H01S 3/098 (2006.01)
H01S 5/00 (2006.01)
H01S 3/08 (2006.01)

(52) U.S. Cl. ............................ 372/18; 372/19; 372/43; 372/50; 372/99; 372/103

(58) Field of Classification Search ................... 372/43, 372/50, 45, 46, 49, 75, 98, 103, 94, 54, 99, 372/18, 19
See application file for complete search history.

(56) References Cited

U.S. PATENT DOCUMENTS

| | | | |
|---|---|---|---|
| 5,293,392 A | * 3/1994 | Shieh et al. ................... | 372/45 |
| 5,426,657 A | 6/1995 | Vakhshoori ................... | 372/45 |
| 5,917,848 A | 6/1999 | Claisse et al. ................ | 372/96 |
| 5,940,422 A | 8/1999 | Johnson ....................... | 372/45 |
| 5,963,576 A | 10/1999 | Claisse et al. ................ | 372/96 |
| 6,683,898 B2 | * 1/2004 | Østergaard et al. ........... | 372/43 |

FOREIGN PATENT DOCUMENTS

| | | |
|---|---|---|
| EP | 1 028 505 A1 | 8/2000 |
| EP | 1 035 621 A | 9/2000 |

OTHER PUBLICATIONS

Martinsson et al., "Transverse Mode Selection in Large-Area Oxide-Confined Vertical-Cavity Surface-Emitting Lasers Using a Shallow Surface Relief", IEEE Photonics Technology Letters, vol. 11, No. 12, Dec. 1999 pp. 1536–1538.
Dowd et al., "Mode Control in Vertical-Cavity Surface-Emitting Lasers by Post-Processing Using Focused Ion-Beam Etching", IEEE Photonics Technology Letters, vol. 9, No. 9, Sep. 1997 pp. 1193–1195.
Claisse et al., "Single high order mode VCSEL", Electronics Letters, vol. 34, No. 7, Apr. 1998, pp. 681–682.
Warren et al., "On-axis far-field emission from two-dimensional phase-locked vertical cavity surface-emitting laser arrays with an integrated phase-corrector", Applied Physics Letters, vol. 61, No. 13, Sep. 1992, pp. 1484–1486.

* cited by examiner

Primary Examiner—Minsun Oh Harvey
Assistant Examiner—Armando Rodriguez
(74) Attorney, Agent, or Firm—Oliff & Berridge, PLC

(57) ABSTRACT

There is provided a surface emitting semiconductor laser satisfying a requirement of making a transverse mode stable and having characteristics of high output power, low resistance, high efficiency, and high speed response and a method for manufacturing the surface emitting semiconductor laser.

Five holes are formed on the top surface of an upper multilayer reflection film formed in the shape of a post by the use of a focused ion beam (FIB) processing unit. One hole is formed on the surface of an upper multilayer reflection film corresponding to the center position of a square current injection region which is about 8 μm square and the remaining four holes are formed at the corners of the square current injection region, for example, at the positions about 2 μm square away from the one hole to produce four light emitting spots.

23 Claims, 20 Drawing Sheets

FIG. 1

|  | HOLE | GROOVE | LIGHT EMITTING SPOT |
|---|---|---|---|
| $LP_{01}$ | | | |
| $LP_{11}$ | | | |
| $LP_{21}$ | | | |
| $LP_{31}$ | | | |
| $LP_{41}$ | | | |
| $LP_{51}$ | | | |

MODE

Top view

NFP

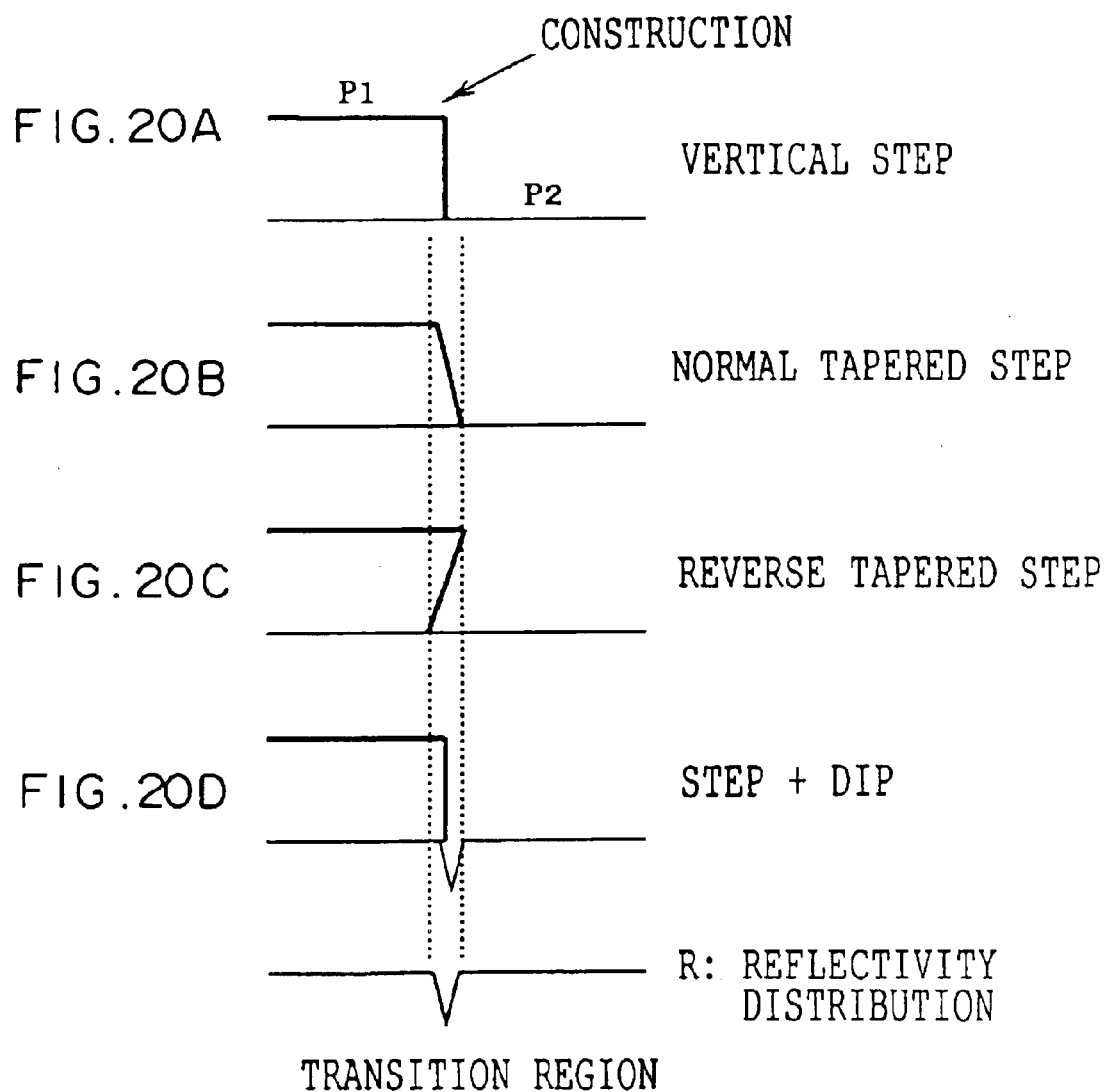

SURFACE EMITTING SEMICONDUCTOR LASER AND MANUFACTURING METHOD THEREOF

BACKGROUND OF THE INVENTION

1. Field of the Invention

The present invention relates to a surface emitting semiconductor and a method for manufacturing the surface emitting semiconductor. In particular, the present invention relates to a surface emitting semiconductor used as a light source for optical information processing and optical communication and as a light source for a data storage device using light and to a method for manufacturing the surface emitting semiconductor.

2. Description of the Related Art

In recent years, the need for a surface emitting semiconductor laser in which a light source is easily arranged in a two-dimensional array (Vertical-Cavity Surface Emitting Laser Diode which is hereinafter referred to as VCSEL) is increasing in the technical field of optical communication and optical recording and the like.

The surface emitting laser has advantages of having a low threshold current and lower power consumption, easily producing a circular optical spot, and being excellent in productivity because it can be evaluated in the wafer state. Conversely, it has been known that the volume of an active region is small, and thus the threshold current becomes lower, increases device resistance to a range from several tens Ω to several hundreds Ω and makes it difficult to increase the optical output power of the device to a range from several mW to several tens mW.

Recently, a short-haul optical communication (from several meters to several hundred meters) using a multimode type optical fiber which is manufactured at low cost and is typically a plastic optical fiber (POF) has received much attention. A combination of a single-mode optical fiber and a comparatively long wavelength laser having a wavelength of 1.3 $\mu$m or 1.55 $\mu$m is used for a long-haul optical communication, but these are expensive and not suitable as consumer goods since the cost is too high. On the other hand, the light source device itself used for the multimode type optical fiber needs to be inexpensive, there should be no need for a special optical system and a driving system and the multimode optical fiber must be small in size and weight. For this reason, the surface emitting laser having these features is thought to be a promising device.

Among the typical surface emitting lasers now available in the market is a proton injection type VCSEL. In the proton injection type VCSEL, a small difference in refractive index is produced by a thermal lensing effect caused by heat between a region through which a current passes and the peripheral region thereof to produce a state of weak light confinement. According to this principle, the diameter of a non-proton injection region (current path) is made ten to several tens $\mu$m to produce a laser oscillation. However, it is also known that because a luminous efficiency is reduced by the weak light confinement and heat generation is large, the threshold current is high and a response performance is not good in the state where a bias voltage is not applied thereto.

The proton injection type VCSEL is referred to as a "gain wave guide structure" when classified based on structure. Meanwhile, the type in which a refractive index distribution for light confinement is specifically formed, is a selective oxidation type VCSEL which is classified as a "refractive index wave guide structure". In this type of VCSEL, a refractive index waveguide is formed by selectively oxidizing a part of a semiconductor multilayer reflection film near an active region to produce a strong light confinement effect, so this type of VCSEL has a low threshold current and a high response performance.

However, even in the selective oxidation type VCSEL showing a good performance, if the diameter of a light emitting region (nearly corresponding to the diameter of a non-selective oxidation region) is enlarged for the purpose of increasing an output power, the VCSEL is also allowed to produce oscillations of various orders, that is, produces a so-called multimode oscillation. In the multimode oscillation, a spectral line width is made wide and the optical fiber has the mode dispersion characteristics, so the attenuation of signal in the fiber is increased, or a mode state is made unstable and thus the main order of mode of the oscillation is easily varied by a change in the amount of current injected and a change in the environmental temperature. A dynamic change in the mode order is not preferable because it changes a coupling efficiency with the fiber.

To avoid this problem, there is a method of controlling an oscillation transverse mode so as to oscillate only in a fundamental mode of the lowest order (0 order) by making the diameter of the light emitting region smaller.

However, the diameter of the light emitting region of the VCSEL needs to be reduced, typically, to 4 $\mu$m or less, which is smaller than that of the above-described proton injection type VCSEL, and thus these VCSEL has a defect of having a high element resistance and being unable to produce high output power. Making the transverse mode stable is an important requirement for preventing the signal from being attenuated when the VCSEL is optically coupled to the optical fiber. In addition, it is necessary to improve electric optical characteristics.

Among ideas for simultaneously realizing opposing goals of making the transverse mode stable, and reducing resistance and increasing output power in the selective oxidation type VCSEL having excellent luminous efficiency and high response performance, is a VCSEL having a structure disclosed in IEEE Photonics Technology Letters, Vol. 11, No. 12, page 1536–1538 (see FIG. 13). In this example, the diameter of the light emitting region is as large as 20 $\mu$m but the inside of an electrode aperture emitting laser light is etched away to a depth of 40 nm except for a region of a radius of 7.75 $\mu$m from the center of the aperture.

The report discloses the following: Since the diameter of the light emitting region is as large as 20 $\mu$m, in the case where there is no surface processing, the order of oscillation mode is varies in accordance with the amount of injection current and thus a far-field image is observed to vary; in contrast, a surface emitting semiconductor laser with a hole produces a fundamental mode up to an optical output of 0.7 mW but when current exceeding that level is injected, the mode splits to gradually widen the far-field image.

The purpose of the VCSEL described above is to improve the optical output power in the fundamental mode. However, the maximum optical output power of the surface emitting semiconductor laser with a hole is 10.4 mW, whereas the output power in the fundamental mode is only 0.7 mW. Taking into account that the maximum output power in the case where there is no surface processing is 17.9 mW, the report described above clearly shows that it is very difficult to make the transverse mode stable and to produce a large optical output power at the same time.

In this respect, various other VCSEL structures for controlling the mode have been proposed. For example, U.S.

Pat. No. 5,940,422, filed Jun. 28, 1996, assigned to Honeywell Inc. discloses a VCSEL in which a mode control is performed by forming two regions of different film thicknesses. In this invention, only a region on which an additional film is deposited becomes a light emitting region. It is thought that the purpose of the invention is to artificially determine the position of a light emitting spot and not to determine the position by taking into consideration the specific oscillation to be produced in the VCSEL (for example, the oscillation mode of producing five light emitting spots, described as one preferred embodiment, does not exist in the natural world).

Further, U.S. Pat. No. 5,963,576, filed Aug. 4, 1997, assigned to Motorola Inc. discloses a VCSEL having an annular waveguide. It is thought that the purpose of the invention is to produce a mode in which light emitting spots are arranged regularly in an annular region so as to produce a super resolution spot and not necessarily to deliberately produce a specific oscillation mode of a determined order.

IEEE Photonics Technology Letters, Vol. 9, No. 9, published in September 1997, page 1193–1195, authored by University of Bristol and Hewlett Packard Labs. discloses a VCSEL having a configuration in which a circular cavity is formed on the top surface of a post by etching to locally vary a mirror reflectivity. The report discloses that the spectral line width of this device is reduced to a half of that of a device with no cavity to produce an effect of suppressing the mode. However, as the amount of current injected increases, an oscillation spectrum is observed to vary. This clearly shows that a specific oscillation mode is not always dominant, in other words, that the mode is not stable.

Further, Electronics Letters, Vol. 34, No. 7, published in April 1998, page 681–682, by Motorola Inc. proposes a VCSEL having a configuration in which a circular cavity is formed on the top surface of a post by etching and in which an annular light emitting region is formed on the outer peripheral portion of the cavity. It is clear from a near-field pattern that a very high order (larger than 30th order) mode is produced and at the same time that there are large variations in the intensity of light emitting spot. This shows that it is difficult to inject a uniform current into the annular region of an inside diameter as large as 30 µm. Therefore, there is plenty of room for improvement of the VCSEL in order to obtain a stable high order mode oscillation for practical application.

As described above, as to the VCSEL expected as a light source for a multimode type optical fiber, the state of art in the VCSEL technology can not provide a device that satisfies a requirement of stabilizing a transverse mode and has high output power, low resistance, high efficiency and high speed response.

SUMMARY OF THE INVENTION

Therefore, it is the object of the present invention to provide a surface emitting semiconductor laser satisfying a requirement of stabilizing a transverse mode and having characteristics of high output power, low resistance, high efficiency and high speed response, and a method for manufacturing the surface emitting semiconductor laser. Another object of the present invention is to provide a method for manufacturing a surface emitting semiconductor laser having the characteristics described above simply and such that it is highly reproducible.

In order to achieve the object described above, according to a first aspect of the present invention, there is provided a surface emitting semiconductor laser which is equipped with a resonator and includes a first reflection layer in which a light emitting region is formed, an active layer and a second reflection layer formed so as to sandwich the active layer between the first reflection layer and itself, wherein the light emitting region includes a boundary region for suppressing the light emission of oscillation modes except for a specific oscillation mode; and a plurality of divided regions which are substantially divided by the boundary region to produce a light emitting spot corresponding to the specific oscillation mode.

According to the first aspect of the present invention, the boundary region is formed so as to suppress the light emission of oscillation modes except for the specific oscillation mode, for example, such that the round trip of the resonator is relatively increased by the divided regions to form the light emitting spot corresponding to the specific oscillation mode in the divided region.

It is essential that such a boundary region is made in at least one of the first reflection layer and the second reflection layer which relates to light emission, and preferably is made in the reflection layer which forms a light emitting side.

Further, the boundary region may be formed not only on the uppermost layer of the reflection layer but also on the upper layer, the inner layer or the lowermost layer of the reflection layer relating to resonance. This configuration can be realized, for example, by selectively growing at least one layer of the respective layers constituting the light emitting region by the crystal growing method or the like such that the reflection state of light varies at a portion of the light emitting region corresponding to the boundary region. In other words, by increasing the round trip by the divided regions. In this respect, the boundary region is formed so as to include the central region to suppress a zero order mode.

Still further, there are cases where when the diameter of the light emitting region is large, the optical spot might be further divided to hop to a higher order mode. For this reason, it is effective to prevent the mode hopping and to fix the oscillation mode by appropriately selecting the sizes of the respective regions divided by the boundary regions. For example, it is preferable that the respective regions are divided by the boundary regions such that the diameters of the light emitting spots produced in the respective regions divided by the boundary regions become about 3 µm because this size of light emitting spot increases stability.

Further, a second aspect of the present invention provides the surface emitting semiconductor laser according to the first aspect, wherein the boundary region is a recess formed in a part of a surface layer which forms a light emitting surface of the light emitting region. According to the second aspect of the present invention, there is provided, since the boundary region is formed in the shape of a recess and the bottom portion of the cavity is larger in a round trip than other portion (divided portions), this portion acts as the boundary region.

Such a recess may be formed, for example, of one or more holes according to the fourth aspect of the present invention or of grooves according to the fifth aspect. Of course, the holes and the grooves may be formed in combination and the number and shape of the recesses can be appropriately selected according to the mode required.

Further, the boundary region can be formed not only as the recess described above but also as a projection. That is, the third aspect of the present invention has the surface emitting semiconductor laser according to the first aspect, and the boundary region is a projection formed in a part of the surface layer which forms the light emitting surface of the light emitting region. According to the third aspect of the present invention, the bottom portion of the projection is made different in reflectivity from the other regions (divided regions) by forming the boundary region in the shape of the projection and thus acts as the boundary region.

Further, it is preferable according to the sixth aspect of the present invention that the size of the light emitting region is large enough to permit light emission of the specific oscillation mode.

Further, it is preferable according to the seventh aspect of the present invention that a reflectivity of the resonator in the light emitting region is smaller than a reflectivity of the resonator in the divided region.

That is, according to the seventh aspect of the present invention, the boundary region has the reflectivity smaller than the reflectivity in the divided region. Since the reflection state as the resonator is made partially small in this boundary region, the light emitting region is divided to form the light emitting spot corresponding to the specific oscillation mode as a whole.

Further, according to the eighth aspect of the present invention, it is preferable that a surface emitting semiconductor laser further includes a current confinement layer that is disposed between the first reflection layer and the active layer and is so oxidized as to have a non-oxidation region corresponding to the amount of injection of current necessary for emitting light of the specific oscillation mode.

Further, according to the ninth aspect of the present invention, it is preferable that the oscillation mode is a linear polarized mode and that the specific oscillation mode is a linear polarized mode of an order of one or more.

Further, as the recess formed by etching becomes deeper, the loss of the active layer increases and thus the boundary region becomes clearer but the output power as the laser decreases, so it is preferable that the recess has an appropriate depth. Therefore, according to the tenth aspect of the present invention, it is preferable that a layer adjacent to the surface layer is an etching preventing layer made of a material for preventing etching. In this case, for example, in the case where a plurality of recesses are formed, the etching preventing layer is particularly effective because it can form all the recesses in the same depth without the need to carry out precise control.

As described above, according to the surface emitting semiconductor laser of the present invention, it is possible for the first time to realize not only the high efficiency and high speed response but also a stable oscillation mode and characteristics of high output power and low resistance of the selective oxidation type VCSEL.

Further, according to the eleventh aspect of the present invention, there is provided a method for manufacturing a surface emitting semiconductor laser, the method comprising the steps of: laminating in sequence, on the main surface of a semiconductor substrate, a lower reflection layer, an active layer in which a quantum well layer is formed, and an upper reflection layer having a surface layer which forms a light emitting surface of a light emitting region on an inner layer side or an upper layer side of said upper reflection layer; forming a post portion in the shape of a pillar with at least the upper reflection layer partially remaining; and forming a boundary region for suppressing light emission of oscillation modes except for a specific oscillation mode and substantially forming a light emitting spot corresponding to the specific oscillation mode by processing a part of the region of the surface of the upper reflection layer which is exposed to the surface of the post portion.

According to the eleventh aspect of the present invention, in the step of laminating, the lower reflection layer, the active layer in which a quantum well layer is formed, and the upper reflection layer having a surface layer which forms a light emitting surface of a light emitting region on the internal layer side or the upper layer side of the main surface are laminated in sequence on the semiconductor substrate, and then the post portion in the shape of a pillar is formed with at least the upper reflection layer partially remaining to form the resonator constituting the surface emitting semiconductor laser, and then the boundary region for suppressing the light emission of an oscillation modes except for a specific oscillation mode and substantially forming a light emitting spot corresponding to the specific oscillation mode is formed by processing a portion of a region of the surface of the upper reflection layer exposed to the surface of the post portion.

The boundary region is the region for suppressing the light emission of the oscillation except for that of the specific oscillation mode and substantially forming the light emitting spot corresponding to the specific oscillation mode and the region like this can be formed, for example, by making a reflectivity of the resonator in this region different from a reflectivity in the other region.

In order to make the reflectivity of the resonator in this region different from the reflectivity in the other region, it is recommended that a part of the surface of the upper reflection layer be processed to make its thickness or refractive index in this region different from those in the other regions. As the processing method, a method of partially removing the upper layer of the region corresponding to the boundary regions or further additionally laminating layers on the regions other than the regions corresponding to the boundary regions may be used.

Further, by removing a part of the layer as the boundary region by the use of etching, at least one of the recess and the projection may be formed and by the use of the lithography technology, the recess may be formed by adding a layer in which the boundary region is not formed or the projection may be formed by adding only the portion of the boundary region.

Further, etching is most suitable for the method for removing a part of the upper layer of the region corresponding to the boundary region. In the case of forming the boundary region of a plurality of recesses, it is preferable that all the recesses have the same reflectivity and, to realize this, all the recesses need to be etched such that their depths are the same. To this end, it is necessary to control etching conditions with high accuracy but it is difficult to form the recesses with high accuracy such that their depths are the same only by controlling the etching conditions with high accuracy.

That is, a nonuniform reflectivity distribution is produced in the plane of the resonator by the surface processing to make an effect on optical wave guide characteristics and, for example, in the case where the surface processing is performed by etching, the depth of etching is an important parameter. Since the characteristics of a DBR (Distributed Bragg Reflector) mirror constituting the resonator of the VCSEL depends on the refractive index inherent in the material and its film thickness and varies periodically, when the film thickness varies according to the depth of etching, a mirror reflectivity periodically varies according to the film thickness. In other words, this is because although the absolute value of the depth is important, if the depths of the plurality of regions to be etched away are not equal to each other, the desired reflectivity distribution can not be obtained. Therefore, it is necessary to provide means for uniquely determining the depth of etching.

For this reason, the twelfth aspect of the present invention provides the method for manufacturing a surface emitting semiconductor laser according to the eleventh aspect of the present invention, wherein the step of laminating includes a step of forming an etching preventing layer on the lower layer side of the surface layer.

By forming the etching preventing layer like this, it is possible to etch all the recesses with high accuracy such that their depths are equal without controlling the etching conditions with high accuracy. Therefore, this etching preventing layer is preferable because it increases manufacturing efficiency and decreases manufacturing costs and improves manufacturing yield.

In the inventions described above, a phase difference between light emitting spots of the neighboring divided regions is $\pi$ (180° C.) and thus a far-field pattern (FFP) shows two peaks and coupling efficiency with the optical fiber is lower than that at the light emitting spot which does not have phase difference and shows one peak. Accordingly, in order to eliminate the phase difference and to produce a FFP having one peak, it is desirable to provide a structure capable of producing a phase shift. To this end, the thirteenth aspect of the present invention provides the surface emitting semiconductor laser according to the first aspect, wherein the media of the surface layers which forms the light emitting surfaces of neighboring divided regions have different refractive indices so that the light emitting spots emitted from the neighboring divided regions have the same phase. That is, since an optical path length L is $\lambda/n$ (where $\lambda$ is a wavelength and n is a refractive index), by making the media of the surface layers to be the light emitting surfaces of neighboring divided regions have different refractive indices, it is possible to shift the phases of the light emitting spots and to make the light emitting spots have the same phase. As a result, this decreases the broadening angle and produces the FFP having a single peak and thus can drastically improve the coupling efficiency with the optical fiber or the like. Therefore, it is possible to further increase the output power and the response speed of the semiconductor laser. In this respect, in the present aspect, the phrase of "the same phase" preferably means a state where a phase difference is zero but shall include also a state where the phase difference is not exactly zero but the broadening angle is decreased as compared with the case where a phase shift mechanism is not provided because the target is to reduce the broadening angle. According to the fourteenth aspect of the present invention, the cross sections of the plurality of divided regions are alternately formed in the shape of a recess or in the shape of a projection. That is, the refractive index n of the medium of the divided region formed in the shape of a recess (or divided region adjacent to the divided region formed in the shape of a projection) is different from the refractive index n of the medium of the divided region adjacent to the divided region formed in the shape of a recess (or divided region formed in the shape of a projection). For example, the former is air having a refractive index n of 1 and the latter is a semiconductor having a refractive index n of about 3 and the phases of the regions can be made to have the same phase by controlling the optical path length L. According to the fifteenth aspect of the present invention, it is preferable that according to the fourteenth aspect, when the cross section is formed in the shape of a recess, the shape of the recess is formed by etching and when the cross section is formed in the shape of a projection, the shape of the projection is formed by laminating at least one of a dielectric film, a semiconductor film and a transparent metallic film.

As in the case of the first aspect of the present invention, as a result of controlling the oscillation modes except for the specific oscillation mode without providing the specific boundary region and eliminating a phase difference $\pi$ produced between the light emitting spots of the neighboring divided regions, it is also recommendable to provide a structure for producing a phase shift. To this end, according to the sixteenth aspect of the present invention, there is provided a surface emitting semiconductor laser which is equipped with a resonator and includes a first reflection layer in which a light emitting region is formed, an active layer and a second reflection layer formed so as to sandwich the active layer between the first reflection layer and itself, wherein the light emitting region includes a plurality of divided regions for producing light emitting spots corresponding to a specific oscillation mode and wherein the media of the surface layers which form the light emitting surfaces of neighboring divided regions have different refractive indices so that the light emitting spots emitted from the neighboring divided regions have the same phase. This configuration can eliminate the phase difference $\pi$ produced between the light emitting spots of the neighboring divided regions, as in the case of the thirteenth aspect, and according to the seventeenth aspect, the boundary region of the neighboring divided regions of the plurality of divided regions suppresses the light emission of oscillation modes except for the specific oscillation mode. Accordingly, as in the case of the thirteenth aspect, it is possible to drastically improve the coupling efficiency and to increase the output power and speed of the semiconductor laser and further to manufacture the semiconductor laser at low cost and high yield because the configuration is simple. It is preferable that the plurality of divided regions are alternately formed such that their cross section is the shape of a recess and in the shape of a projection. It is further preferable that when the cross section is formed in the shape of a recess, the shape of the recess is formed by etching and when the cross section is formed in the shape of a projection, the shape of the projection is formed by laminating at least one of the dielectric film, the semiconductor film and the transparent metallic film.

According to the twentieth aspect of the present invention, the boundary region is a stepped portion when the cross sections of the plurality of divided regions are alternately formed in the shape of a recess or in the shape of a projection. Therefore, since the resultant stepped portion is the boundary region for controlling the oscillation mode except for the specific oscillation mode, it is possible to reduce cost and to improve the yield of the semiconductor laser. Here, because the reflectivity of the stepped portion can not be made smaller than that of the boundary region of the grooves specially formed or the like, in order to reduce the reflectivity, it is recommended that the stepped portion be tapered. In another preferable aspect, it is recommended that a dip extending in the direction of depth from the stepped portion be formed so as to emphasize the stepped portion formed in the boundary region between the neighboring divided regions, thereby reducing the reflectivity. In this case, it is further preferable that when the cross section is formed in the shape of a recess by etching, the dip is formed at the same time when the recess is formed.

It should be noted that the term "recess" is used in a broad sense, and encompasses "groove", "hole", "dimple", "concavity" and the equivalent in the present application.

BRIEF DESCRIPTION OF THE DRAWINGS

FIG. 1 is a schematic view to show a relationship between a surface pattern and an electromagnetic field mode pattern based on linearly polarized approximation.

FIGS. 20A to 20D show a normal tapered step and a reverse tapered step.

DETAILED DESCRIPTION OF THE PREFERRED EMBODIMENTS

Figure 2A:
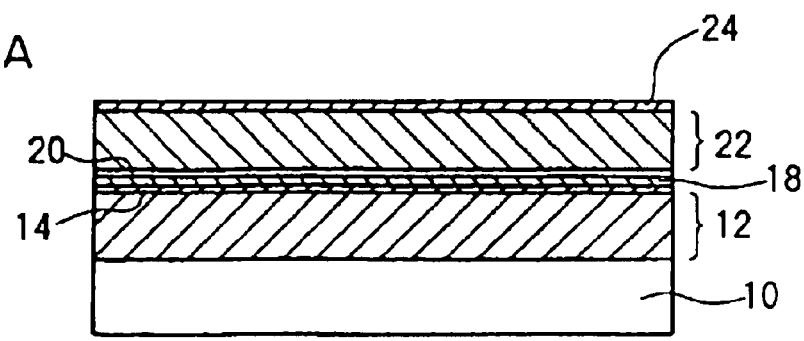
FIGS. 2A to 2H are cross-sectional views to show the first half of the process for manufacturing a surface emitting semiconductor laser made in accordance with the first embodiment of the present invention.

First of all, the principle of producing a single high order mode oscillation will be described. An optical mode produced in a light emitting region of a VCSEL can be arrived at from the result obtained by solving a dispersion equation. For example, the optical mode of the VCSEL generally starts from a fundamental mode of $LP_{01}$ and is repeatedly divided to increase the order like $LP_{11}$, $LP_{21}$, ... and so on, thereby being varied until it reaches the maximum order mode which is optically permitted while being affected by external factors such as carrier distribution or the like. Therefore, if only a reflectivity in a region of a weak optical intensity (corresponding to the square of electric field distribution) is intentionally reduced according to the shape of a desired mode, it is easy for an oscillation to be selectively generated in the desired mode.

Further, a mode pattern (electric field intensity distribution) required for a mode has been reported and a mode pattern (electric field intensity distribution) required for a LPnm (linearly polarized) mode is disclosed in Applied Optics Vol. 15, No. 1 page 239–243.

For example, in FIG. 1 are shown a $LP_{11}$ mode in which the light emitting spot is divided into two spots with respect to the $LP_{01}$ mode (fundamental mode), a $LP_{21}$ mode in which the light emitting spot is divided into four spots, a $LP_{31}$ mode in which the light emitting spot is divided into six spots, a $LP_{41}$ mode in which the light emitting spot is divided into eight spots, and a $LP_{51}$ mode in which the light emitting spot is divided into ten spots. Here, in the schematic view to show the light emitting points in FIG. 1, broken lines drawn between the spots are imaginary lines for indicating the boundaries of the modes.

In the case where the boundary regions are formed of holes, the $LP_{11}$ mode can be obtained by making one hole in a region corresponding to the center of the light emitting spot or a plurality of holes along the boundary lines (imaginary lines), and in the case where the boundary regions are formed of grooves, the $LP_{11}$ mode can be obtained by making long grooves passing through the region corresponding to the center of the light emitting spot.

In the case where the boundary regions are formed of the holes, the $LP_{21}$ mode can be obtained by making one hole in the region corresponding to the center of the light emitting spot and four holes around the one hole, and in the case where the boundary regions are formed of grooves, the $LP_{21}$ mode can be obtained by making four long grooves arranged at an angle of 90 degrees with respect to each other around the region corresponding to the center of the light emitting spot.

In the case where the boundary regions are formed of holes, the $LP_{31}$ mode can be obtained by making one hole in the region corresponding to the center of the light emitting spot and six holes around the one hole, and in the case where the boundary regions are formed of grooves, the $LP_{31}$ mode can be obtained by making six long grooves arranged at an angle of 60 degrees with respect to each other around the region corresponding to the center of the light emitting spot.

Further, in the case where the boundary regions are formed of the holes, the $LP_{41}$ mode can be obtained by making one hole in the region corresponding to the center of the light emitting spot and eight holes around the one hole, and in the case where the boundary regions are formed of grooves, the $LP_{41}$ mode can be obtained by making eight long grooves arranged at an angle of 45 degrees with respect to each other around the region corresponding to the center of the light emitting spot.

Still further, in the case where the boundary regions are formed of holes, the $LP_{51}$ mode can be obtained by making one hole in the region corresponding to the center of the light emitting spot and ten holes around the one hole, and in the case where the boundary regions are formed of grooves, the $LP_{51}$ mode can be obtained by making ten long grooves arranged at an angle of 36 degrees with respect to each other around the region corresponding to the center of the light emitting spot.

In this respect, it is clear that the holes and the grooves in FIG. 1 correspond to the boundary regions of the present invention and the light emitting spots obtained are formed in the regions divided by the respective holes and grooves.

To describe the present invention in detail, the preferred embodiments to which a surface emitting semiconductor laser in accordance with the present invention and a method for manufacturing the surface emitting semiconductor laser are applied will be described in detail with reference to the drawings.

(First Embodiment)

In the first embodiment, a surface emitting semiconductor laser provided with the boundary region of a spot etching type and a manufacturing method thereof will be described. The method of the present embodiment corresponds to the method of manufacturing a surface emitting semiconductor laser of the eleventh aspect of the present invention.

First, as shown in FIG. 2A, a lower multilayer reflection film 12 formed of a plurality of laminated bodies each of which is formed of a pair of n-type $Al_{0.8}Ga_{0.2}As$ layer and n-type $Al_{0.1}Ga_{0.9}As$ layer, a lower spacer layer 14 formed of an undoped $Al_{0.4}Ga_{0.6}As$ layer, a quantum well active layer (not shown) formed of a laminated body of a quantum well layer formed of an undoped GaAs layer and a barrier layer formed of an undoped $Al_{0.2}Ga_{0.8}As$ layer, an upper spacer layer 18 formed of an undoped $Al_{0.4}Ga_{0.6}As$ layer, a p-type AlAs layer 20, an upper multilayer reflection film 22 formed of a plurality of laminated bodies each of which is formed of a pair of p-type $Al_{0.8}Ga_{0.2}As$ layer and p-type $Al_{0.1}Ga_{0.9}As$ layer, and a contact layer 24 formed of a p-type GaAs layer are laminated in sequence on the (100) surface of an n-type GaAs substrate 10 by the metal organic chemical vapor deposition (MOCVD) method.

The lower multilayer reflection film 12 is formed of the plurality of laminated bodies each of which is formed the pair of n-type $Al_{0.8}Ga_{0.2}As$ layer and n-type $Al_{0.1}Ga_{0.9}As$ layer, wherein each layer has a thickness of $\lambda/4nr$ (where $\lambda$ is an oscillation wavelength and nr is a refractive index of a medium), and is made by laminating layers of 36.5 sets of layers, each having a different composition, in an alternating manner. The carrier concentration of silicon, which is an n-type impurity, is $3\times10^{18}$ cm$^{-3}$.

Further, the quantum well active layer (not shown) is formed of three laminated bodies each of which is made by laminating the quantum well layer formed of the undoped GaAs layer of 8 nm in thickness and the barrier layer formed of the $Al_{0.2}Ga_{0.8}As$ layer of 5 nm in thickness in an alternating manner (however, since the outside layers are formed of barrier layers formed of the undoped $Al_{0.2}Ga_{0.8}As$ layers, the number of barrier layers becomes 4) and produces oscillation having a wavelength band of 850 nm.

The upper multilayer reflection film 22 is formed of the plurality of laminated bodies each of which is formed of the pair of p-type $Al_{0.8}Ga_{0.2}As$ layer and p-type $Al_{0.1}Ga_{0.9}As$ layer, wherein each layer has a thickness of $\lambda/4nr$, and is made by laminating 22 sets of layers, each having a different composition, in an alternating manner, and the number of sets is the sum of the number of p-type layers, the AlAs layer 20 underlying the reflection layer 22 and the contact layer 24 overlying the reflection layer 22. However, as to the AlAs layer 20, all the material constituting the film having a thickness of $\lambda/4nr$ is not necessarily made of AlAs. Conversely, if the AlAs layer is thicker than necessary, there is the possibility that the problem of increasing the optical dispersion loss will be presented. Therefore, the thickness of the AlAs layer is made 20 nm and the remaining portion of the film described above is made of $Al_{0.9}Ga_{0.1}As$. The carrier concentration of silicon, which is a p-type impurity, is $5\times10^{18}$ cm$^{-1}$.

The reason why the number of sets (of layers) of the upper multilayer reflection film 22 is smaller than that of the lower multilayer reflection film 12 is to cause a difference in reflectivity between the two reflection films 22 and 12 and thus allow emission of light from the top surface of the substrate. Further, in order to reduce the series resistance of the device, between the $Al_{0.8}Ga_{0.2}As$ layer and the $Al_{0.1}Ga_{0.9}As$ layer in the upper multilayer reflection film 22 is disposed a so-called intermediate layer having an intermediate aluminum composition between the aluminum compositions of the two layers, which will not be described in detail.

The total thickness from the bottom surface of the lower spacer layer 14 to the top surface of the upper spacer layer 18 is set at an integer times $\lambda/4nr$ to produce a standing wave between the bottom surface of the lower spacer layer 14 and the top surface of the upper spacer layer 18, thereby bringing the portion of the strongest light intensity, that is, the loop of the standing wave to the position of the quantum well active layer.

The thickness of the contact layer 24 formed of the p-type GaAs layer ranges from 20 nm to 50 nm and the carrier concentration of zinc, which is a p-type impurity, is $1\times10^{20}$ cm$^{-3}$.

Figure 2B:
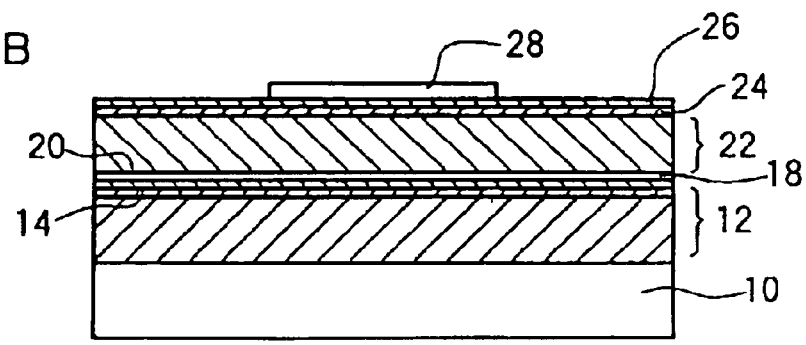
Figure 2C:
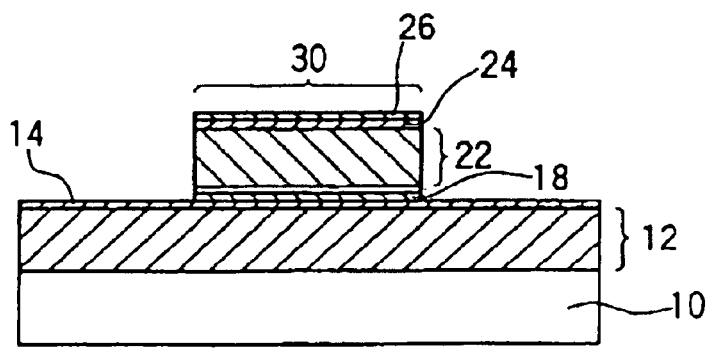
Figure 2D:
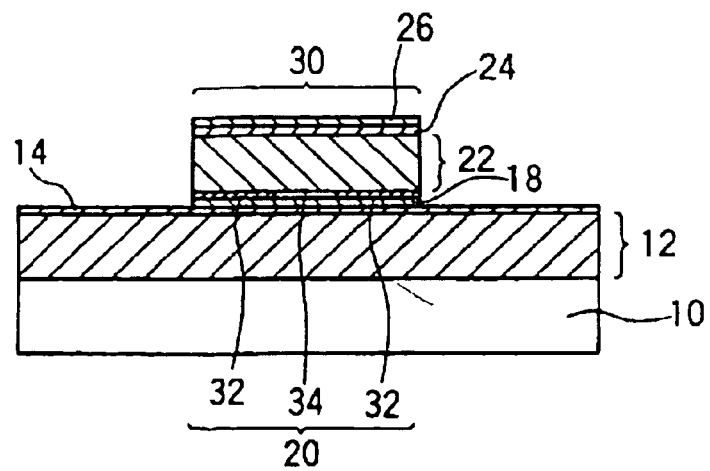

Next, the laser substrate is taken out of the growth chamber and SiON 26 which is a masking material used for etching is deposited on the surface of the substrate and then, as shown in FIG. 2B, a square resist mask 28 is formed on the SiON 26 and the exposed SiON 26 is removed by buffered HF. By using the remaining SiON 26 as an etching mask, the contact layer 24 and the upper multilayer reflection film 22 are etched down by a reactive ion beam using a raw material gas of $BCl_3:Cl_2$ to expose at least the AlAs layer 20, thereby forming a post portion 30 shaped like a square pillar having 30 $\mu$m square, as shown in FIG. 2C. However, etching may be performed to the depth reaching the lower multilayer reflection film 12 or the GaAs substrate 10 and the depth of etching is not directly related to the contents of the present invention.

In this manner, at least the upper multilayer reflection film 22 is formed in the shape of a mesa (post) and then is exposed to an atmosphere of steam at a temperature of 360° C. for 40 minutes by using a nitrogen gas as a carrier gas (flow rate: 2.0 l/min). In this process, the AlAs layer 20 constituting a part of the upper multilayer reflection film 22 is oxidized from the outer peripheral portion because the oxidation speed of the AlAs layer 20 is very much larger than those of the $Al_{0.8}Ga_{0.2}As$ layer and the $Al_{0.1}Ga_{0.9}As$ layer. Then an insulating region (current confinement region) reflecting the shape of the post is formed on the portion directly above the active region of a portion of the post, whereas a non-oxidized region 34, which is left non-oxidized, becomes a current injection region. In the experiment performed under the above conditions, a square current injection region 8 μm square was formed.

Figure 2E:
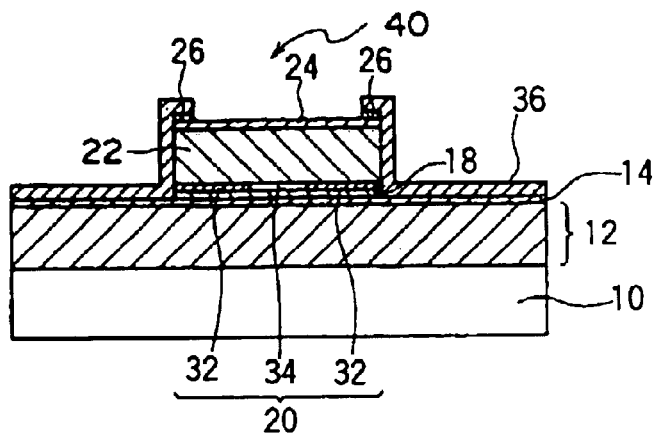

Then, a photosensitive polyimide 36 is deposited on the top surface of the substrate including the side surface of the exposed post portion and then only the photosensitive polyimide 36 deposited on the top of the post portion 30 is removed by the photolithography and then the SiON 26 used for forming the post portion 30 is removed, as shown in FIG. 2E, to expose the contact layer 24 on the top of the post portion 30.

Figure 2F:
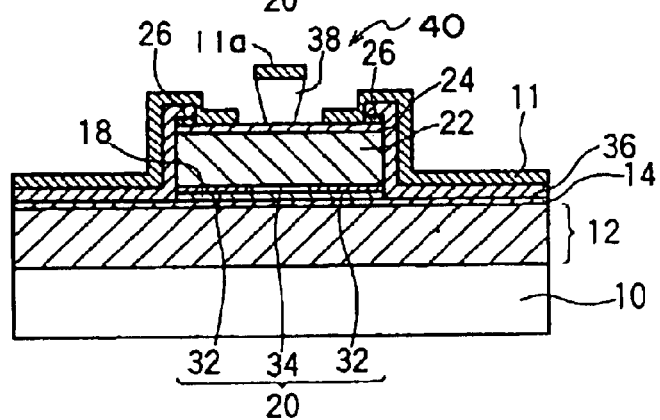
Figure 2G:
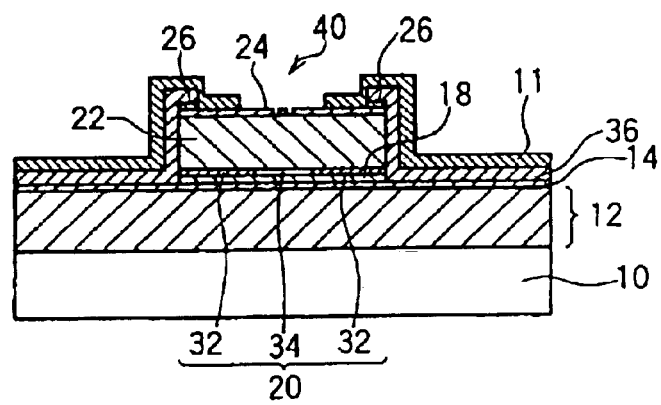

Next, a square resist construction 38 which is about 10 μm square is formed on the center region of the top of the post portion 30 and then Au, Zn and Au are continuously deposited thereon from above by the electron beam evaporation (see FIG. 2F). Thereafter, when the resist construction 38 is removed, the Au, Zn and Au 11a deposited on the top surface of the resist construction 38 are removed (lifted off) together, as shown in FIG. 2G, to form an electrode aperture 40 along with a p side electrode 11 on the top of the post portion 30.

Figure 3A:
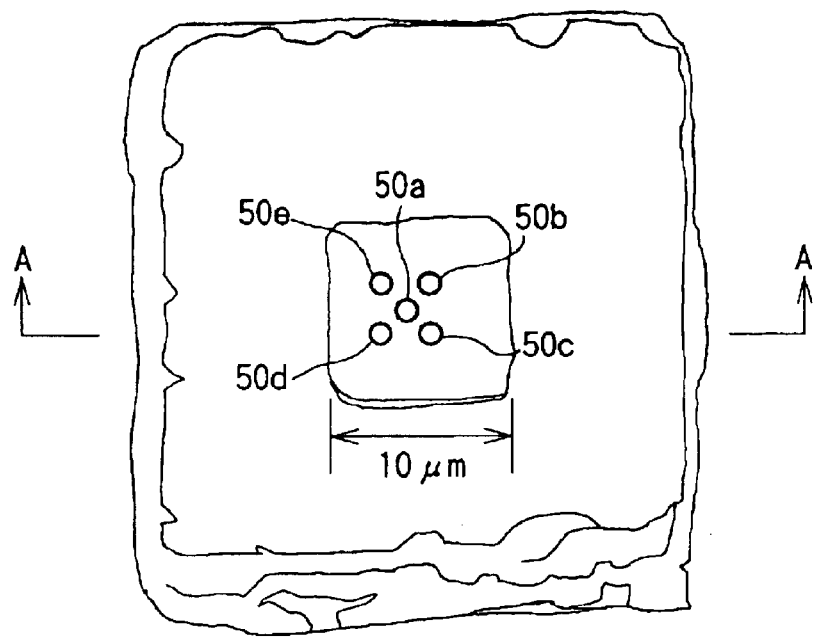
FIG. 3A is a top schematic view of the surface emitting semiconductor laser made in accordance with the first embodiment of the present invention.
Figure 3B:
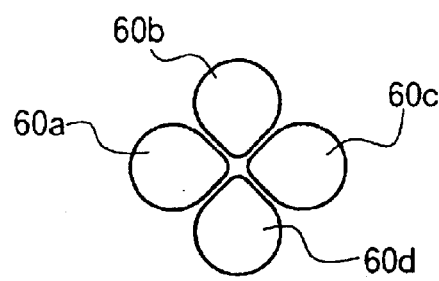
FIG. 3B is a schematic view to show a spot produced by the surface emitting semiconductor laser in FIG. 3A.
Figure 3C:
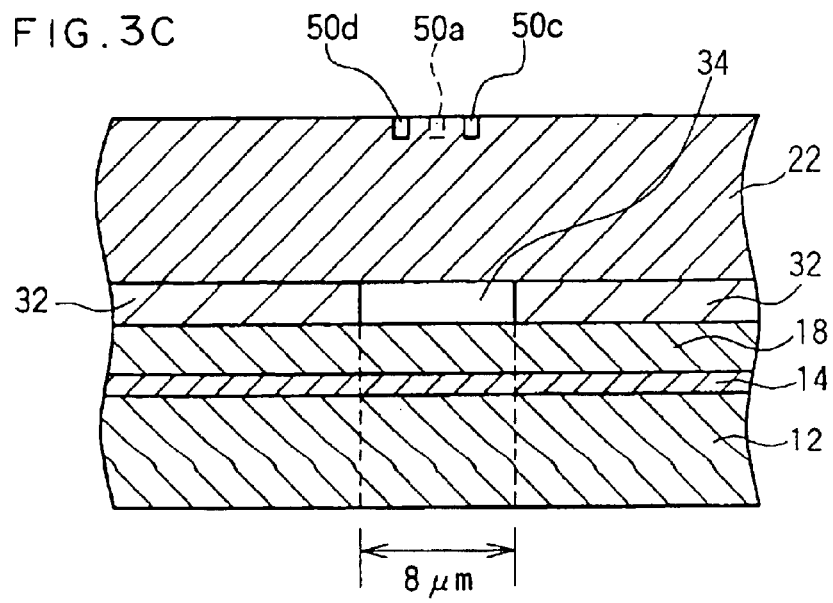
FIG. 3C is a cross-sectional view taken on a line A—A in FIG. 3A.

Next, as shown in FIG. 3A, five circular holes 50a to 50e are formed in the electrode aperture 40 by the use of a focused ion beam (FIB) processing system. Here, these circular holes 50a to 50e correspond to the boundary regions in the first aspect, the recesses in the second aspect, and the holes of the fourth aspect of the present invention. One hole 50a is formed, for example as shown in FIG. 3C, on the surface of the upper multilayer reflection film 22 corresponding to the center position of the square current injection region about 8 μm square and remaining four holes 50b to 50e are formed at the corners of the square current injection region, for example, at the positions of about 2 μm away from the hole 50a. Here, each of the holes 50a to 50e has a diameter of about 0.5 μm, for example, and a depth reaching the upper multilayer reflection film 22, for example, of about 0.5 μm. Of course, it is not intended to limit the present invention to these dimensions. In the case where these five holes 50a to 50e are formed, as shown in FIG. 3B, four light emitting spots 60a to 60d are obtained.

Figure 2H:
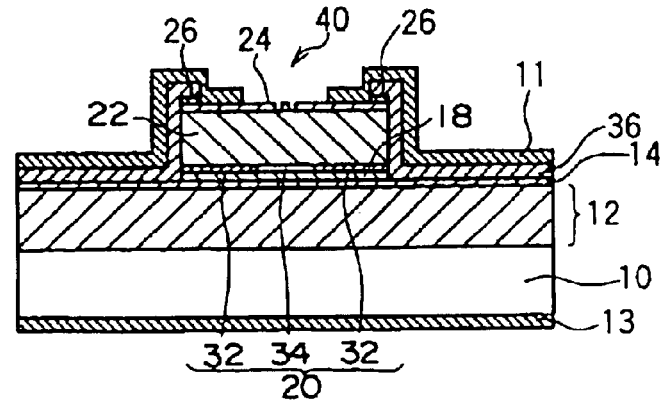

Finally, Au—Ge/Ni/Au is deposited on the bottom surface of the substrate as an n-side electrode 13 and is subjected to a heat treatment in a nitrogen atmosphere at 350° C. for ten minutes to produce a surface emitting semiconductor laser of a configuration shown in FIG. 2H.

Figure 4:
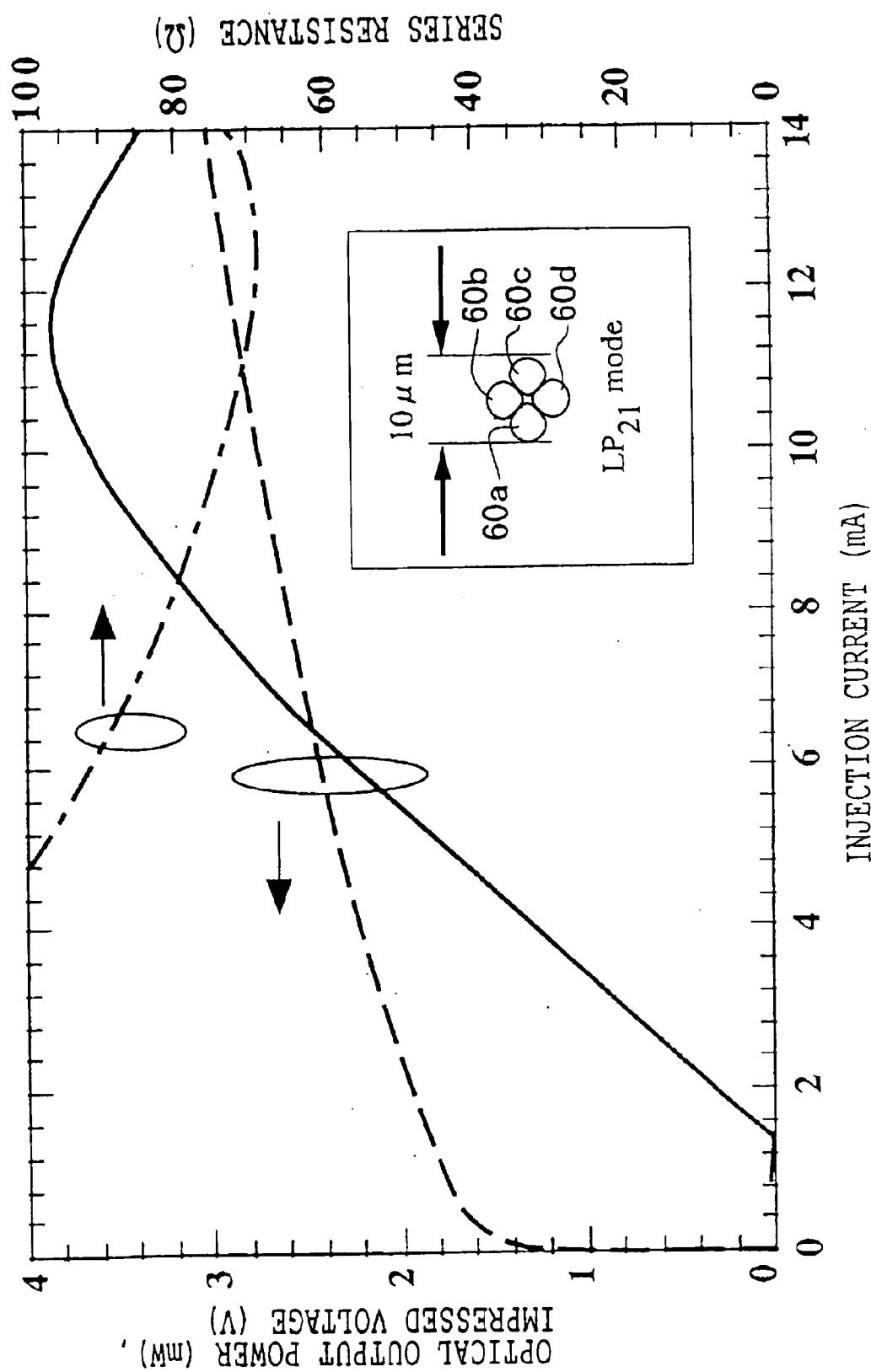
FIG. 4 is a graph to show the optical output power-injection current (L-I) characteristics and an explanatory view to schematically show a near-field image of the surface emitting semiconductor laser made in accordance with the first embodiment of the present invention.

Here, optical output power-injection current (L-I) characteristics and a near-field image produced by the surface emitting semiconductor laser obtained in this manner will be shown in FIG. 4. An $LP_{21}$ mode oscillation which is stable in all current injection region was obtained and the maximum optical output power was 3.5 mW and series resistance was 80 Ω at the optical output power of 3 mW. Here, in FIG. 4, the optical output power is shown by a solid line, the series resistance is shown by a single dot and dash line, and the injection current is shown by a broken line, respectively.

Figure 5:
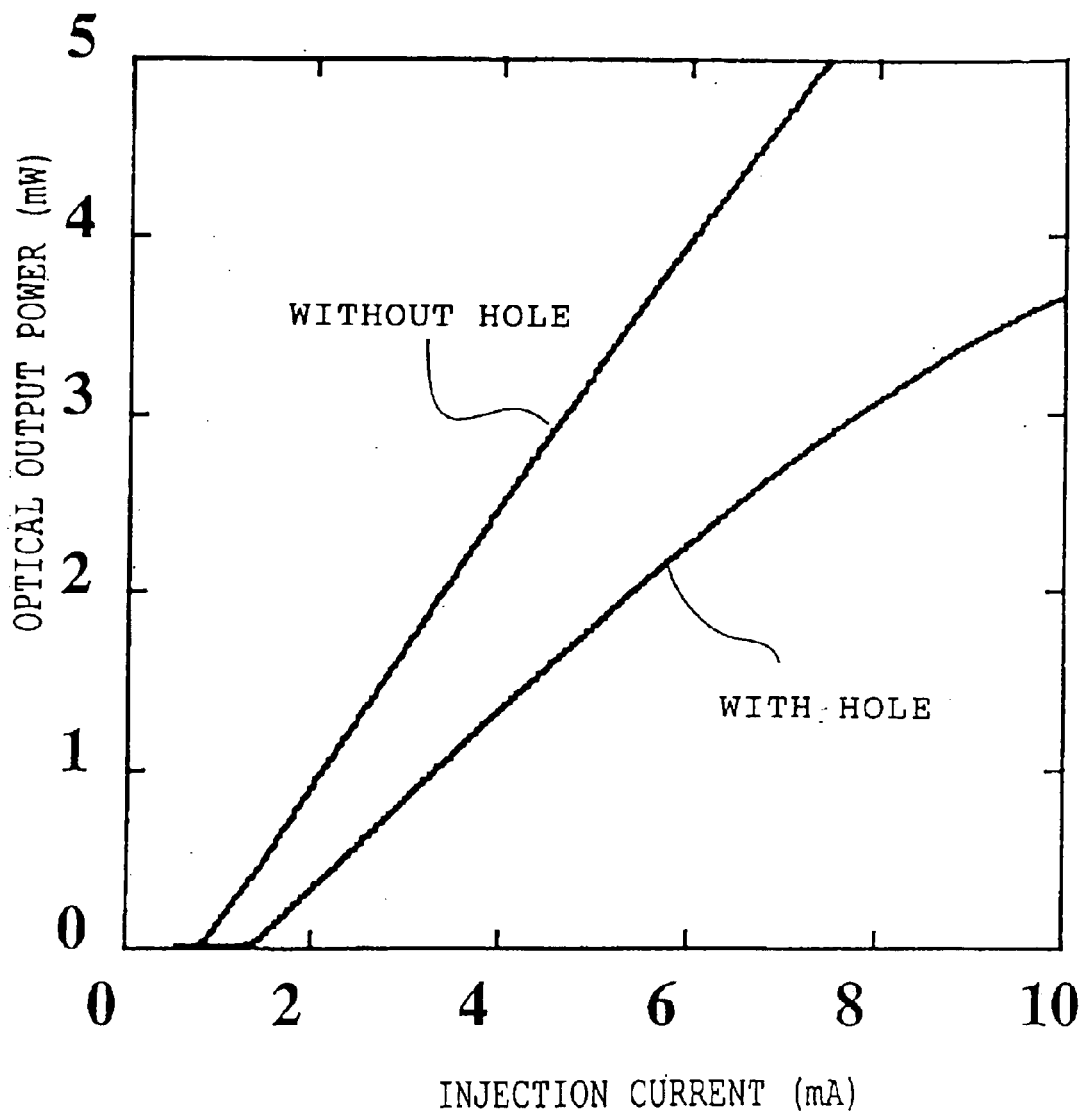
FIG. 5 is a characteristic graph for the comparison of the L-1 characteristic of the surface emitting semiconductor laser made in accordance with the first embodiment of the present invention.

Further, FIG. 5 shows the comparison of L-I characteristics of a surface emitting semiconductor laser that had the non-oxidation region 34 of the same size and was not subjected to the surface processing and did not have five circular holes 50a to 50e (hereinafter referred to as a surface emitting semiconductor laser with no hole) with a surface emitting semiconductor laser that had the non-oxidation region 34 of the same size and was subjected to the surface processing and had five circular holes 50a to 50e (hereinafter referred to as a surface emitting semiconductor laser with hole). As is evident from FIG. 5, a resonance loss is increased by the surface processing to increase a threshold current and to decrease the optical output power by half.

Figure 6:
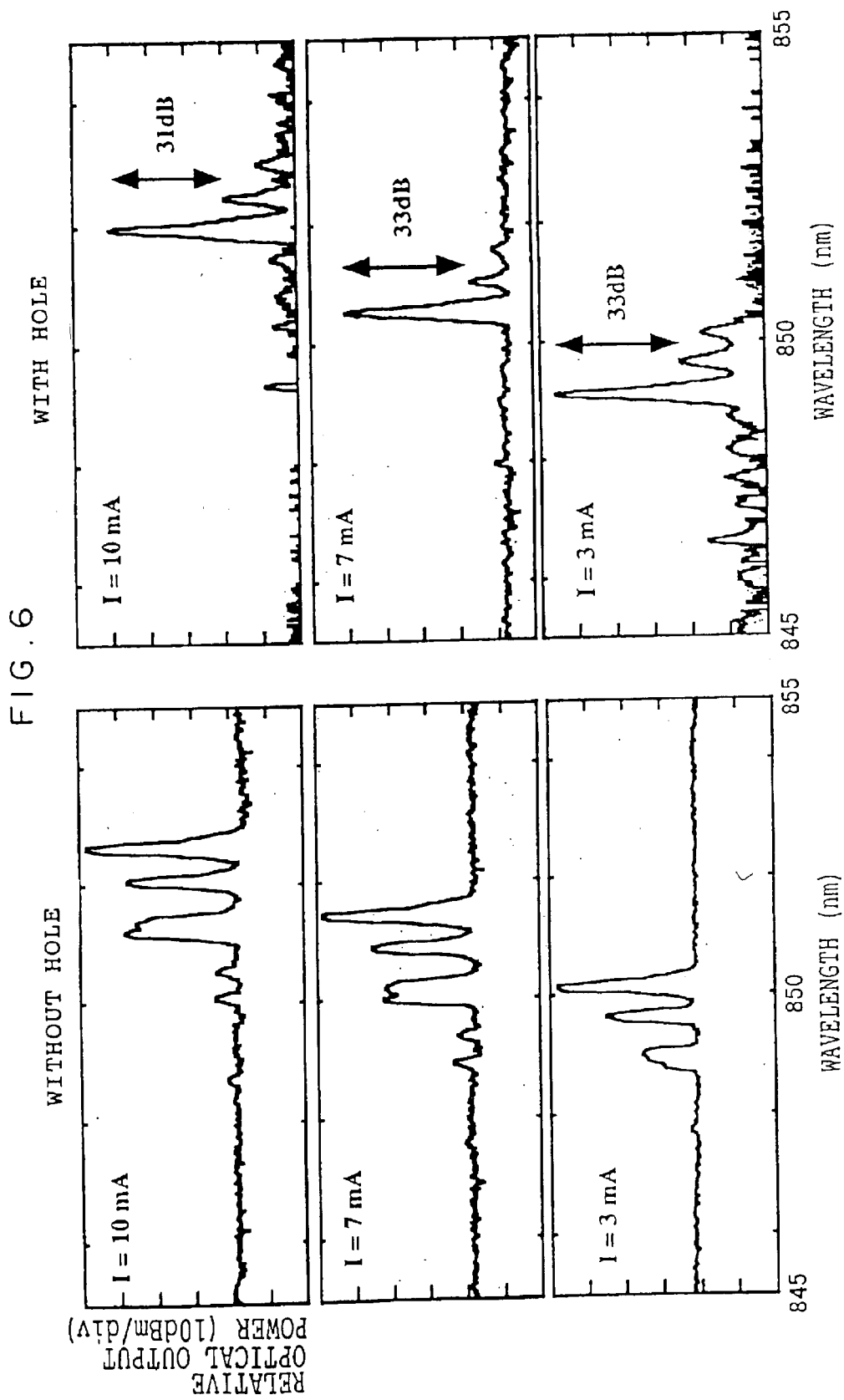
FIG. 6 is a characteristic graph for the comparison of the oscillation spectrum of the surface emitting semiconductor laser made in accordance with the first embodiment of the present invention.

Still further, in FIG. 6 are shown the graphs of oscillation spectra of the surface emitting semiconductor laser with no hole and the surface emitting semiconductor laser with hole at the injection currents of 3 mA, 7 mA, and 10 mA.

As is evident from FIG. 6, in the surface emitting semiconductor laser with no hole, the spectra corresponding to the respective $LP_{01}$, $LP_{11}$ and $LP_{21}$ modes are observed at the injection current of 3 mA, which reveals that the laser produces a multimode oscillation. In contrast, in the surface emitting semiconductor laser with hole, a spectrum intensity ratio between the $LP_{11}$ mode and the $LP_{21}$ mode is larger than 30 dB even at the injection current of 10 mA, which shows that oscillation of $LP_{21}$ mode is maintained.

Figure 7A:
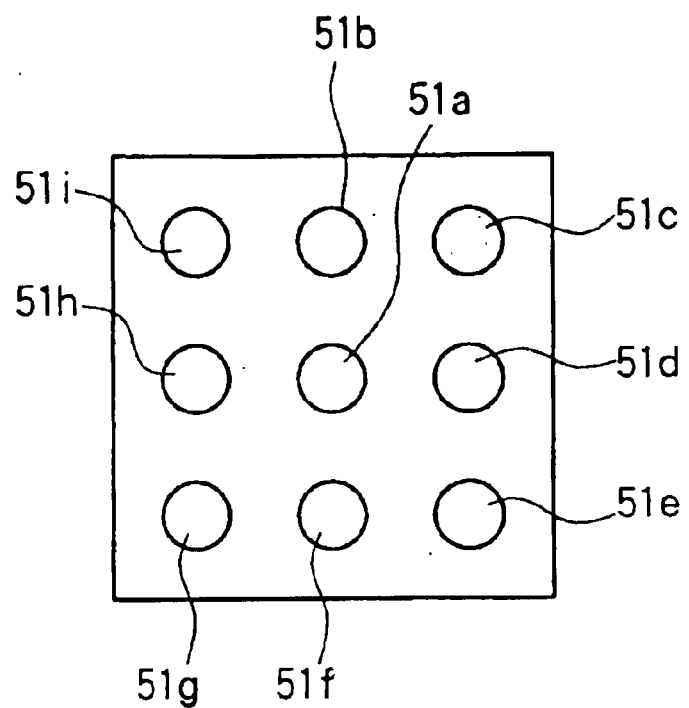
FIG. 7A is a top schematic view to show an application of the surface emitting semiconductor laser made in accordance with the first embodiment of the present invention.
Figure 7B:
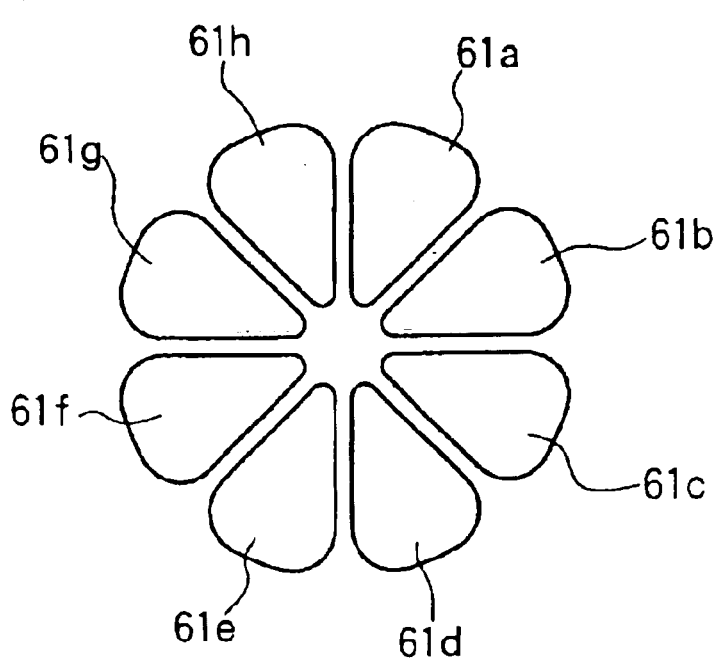
FIG. 7B is a schematic view to show a spot produced by the surface emitting semiconductor laser in FIG. 7A.

While the $LP_{21}$ mode oscillation is produced by making five holes in the above example, it is possible to produce some high order modes other than this mode. For example, as shown in FIG. 7A, by making nine holes 51a to 51i, $LP_{41}$ mode oscillation of light emitting spots 61a to 61h as shown in FIG. 7B can be produced.

In this respect, while the case where the depth of the hole is, for example, about 0.5 μm has been described in the first embodiment, the depth of the hole was varied from about 0.2 μm to about 1.0 μm in the experiment to examine variations in characteristics. As a result, because a decrease in mirror reflectivity was ensured as the depth of hole increased, the selectivity of mode was improved and thus a single mode was apt to be produced. Further, a change relative to depth was no longer critical but the optical output power was decreased overall due to a decrease in the mirror reflectivity. In contrast, it was found that in the case where the hole was shallow, a rate of change relative to the depth was increased and if the depth of the hole was not correctly controlled in accordance with the design of a DBR mirror, the other modes were apt to be produced.

As described above, according to the present first embodiment, it is possible to produce the surface emitting semiconductor laser satisfying the requirement of stabilizing the transverse mode and having the characteristics of high output power, low resistance, high efficiency and high speed response. Further, it is possible to manufacture the surface emitting semiconductor laser like this by a simple manufacturing method in which reproducibility is high.

(Second Embodiment)

While spot etching for forming the circular holes of a small diameter was performed on the surface of the multilayer reflection film to form the recesses for suppressing the light emission of oscillation mode except for the specific oscillation mode in the first embodiment described above, a stripe etching for forming narrow grooves as the recesses to produce the same effect is performed in the present second embodiment. Here, since the longitudinal (lamination) structure of the substrate and manufacturing processes except for the surface processing in the second embodiment are the same as those in the first embodiment, their description will be omitted and description will be made only for the different parts. Further, the method of the present second embodiment corresponds to the method for manufacturing the surface emitting semiconductor laser of the twelfth aspect of the present invention.

Figure 8A:
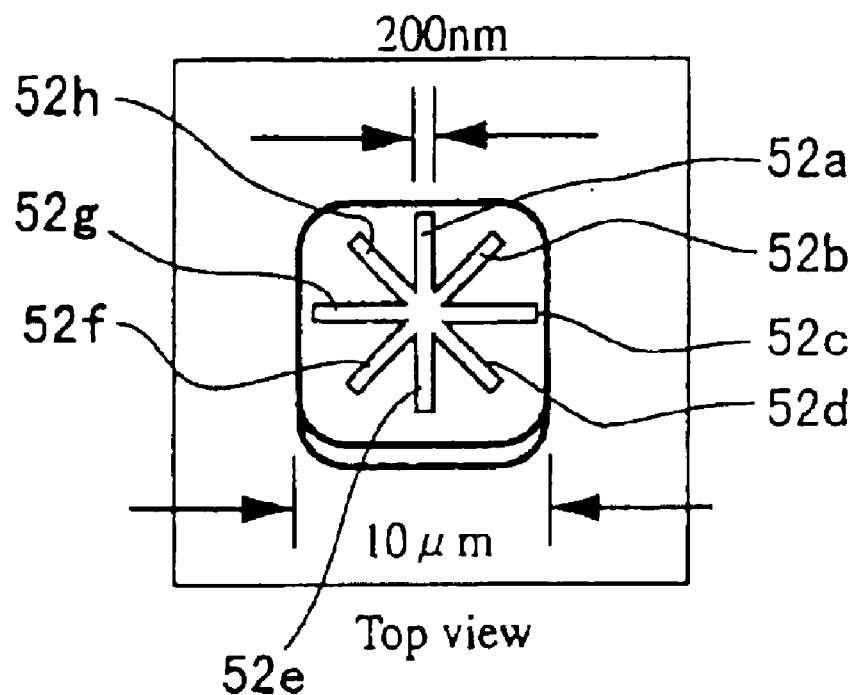
FIG. 8A is a top schematic view to show the surface emitting semiconductor laser made in accordance with the first embodiment of the present invention.

Following the process shown in FIG. 2F in the first embodiment, the surface processing is performed in the electrode aperture 40 by the use of the FIB processing unit, but in the second embodiment, for example, as shown in FIG. 8A, eight stripe grooves 52a to 52h crossing each other at the center portion of the electrode aperture 40 are formed. Here, these eight stripe grooves 52a to 52h correspond to the boundary regions of the first aspect, the recesses of the second aspect and the grooves of the fifth aspect of the present invention.

Figure 8B:
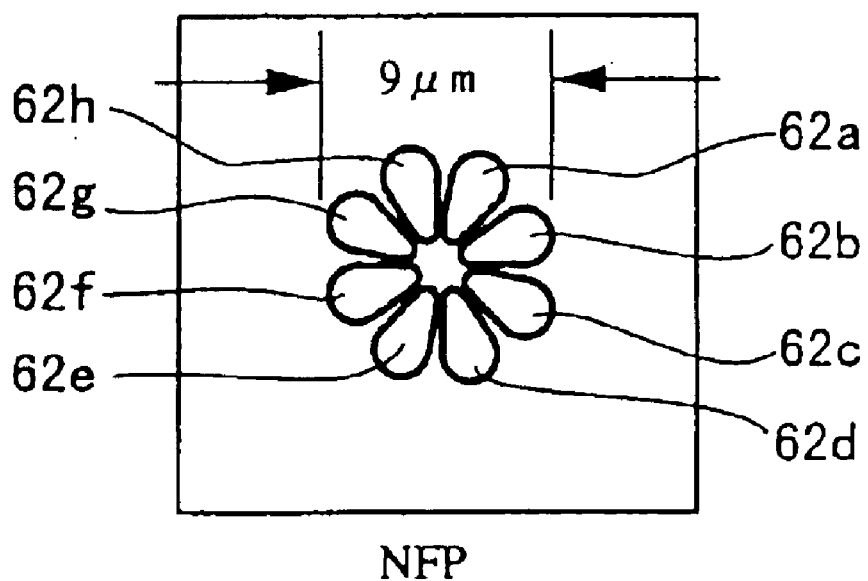
FIG. 8B is a schematic view to show a spot produced by the surface emitting semiconductor laser in FIG. 7A.

Each of the eight stripe grooves 52a to 52h has a width of, for example, about 0.5 $\mu$m, a length of, for example, about 14 $\mu$m and a depth of the same as that of the contact layer 24 to be removed, in this case, about 50 nm. Here, these dimensions are given as an example and it is not intended to limit the present invention to these dimensions. The near-field images of the spots 62a to 62h produced by the surface emitting semiconductor laser having these grooves are shown in FIG. 8B.

Figure 9:
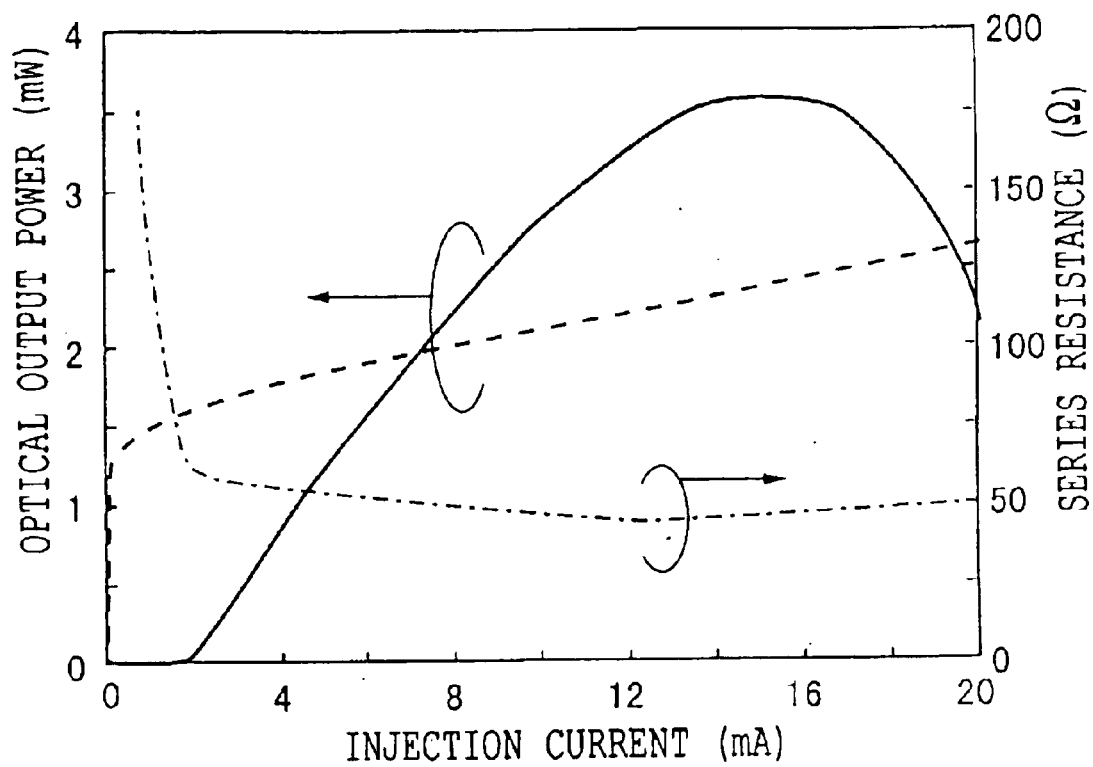
FIG. 9 is a graph to show the optical output power-injection current (L-I) characteristics of the surface emitting semiconductor laser made in accordance with the first embodiment of the present invention.

Further, in FIG. 9 are shown the L-I characteristics of the surface emitting semiconductor laser in accordance with the second embodiment. Here, in the present experiment, following the oxidation process, it was recognized using an infrared microscope that the square current injection region of 9 $\mu$m square was formed. By importing imparting an excessive reflection loss to the mode to be suppressed by surface processing, the $LP_{41}$ mode oscillation which is stable in all the current injection regions could be obtained. Because this oscillation mode has the portions corresponding to the nodes of the standing wave at the grooves, this oscillation mode has small reflection loss and produces selective oscillation. The maximum optical output power was 3.5 mW and the series resistance was as low as about 50 $\Omega$ through all the current injection regions within the oscillation region.

Figure 10:
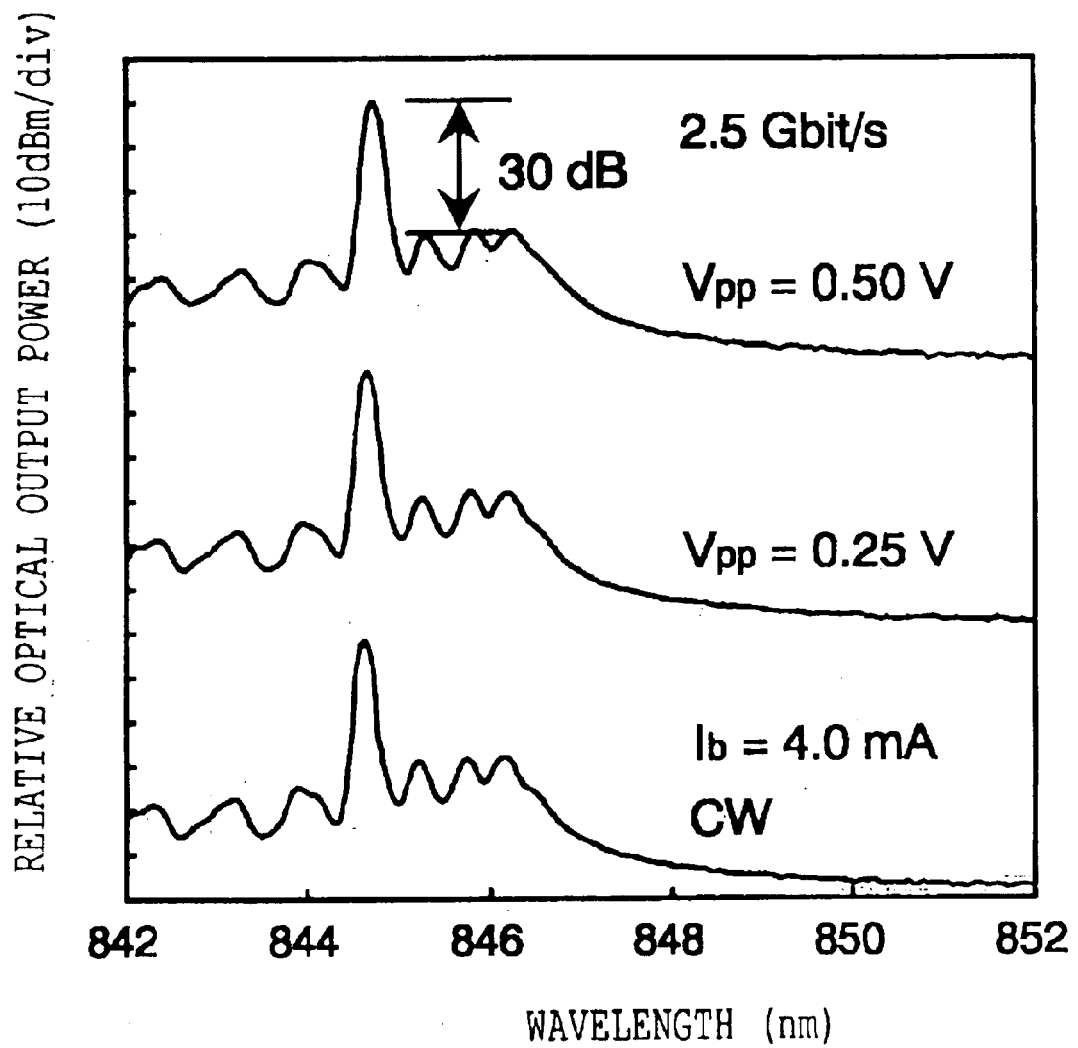
FIG. 10 is a graph to show the oscillation spectrum of a surface emitting semiconductor laser made in accordance with the second embodiment of the present invention.

FIG. 10 shows oscillation spectra when the current was continuously injected and an oscillation spectrum when a non-return-to-zero pseudo-random bit sequence modulation at 2.5 Gigabit/sec was performed at a bias current of 4 mA. It was clear that a sub mode suppression ratio 30 dB was kept under high speed direct modulation.

In this regard, while the case where the current injection region had the size and shape of a 9 $\mu$m square has been described in the present embodiment, the mode characteristics were examined in the experiment for the case of a circular current injection region of 15 $\mu$m in diameter. Eight stripe grooves crossing at the center portion of the electrode aperture were formed, as in the case of the square current injection region described above. As a result, the $LP_{41}$ mode oscillation could be obtained near the oscillation threshold but when the amount of injection current was increased, higher mode oscillations were produced.

Figure 11:
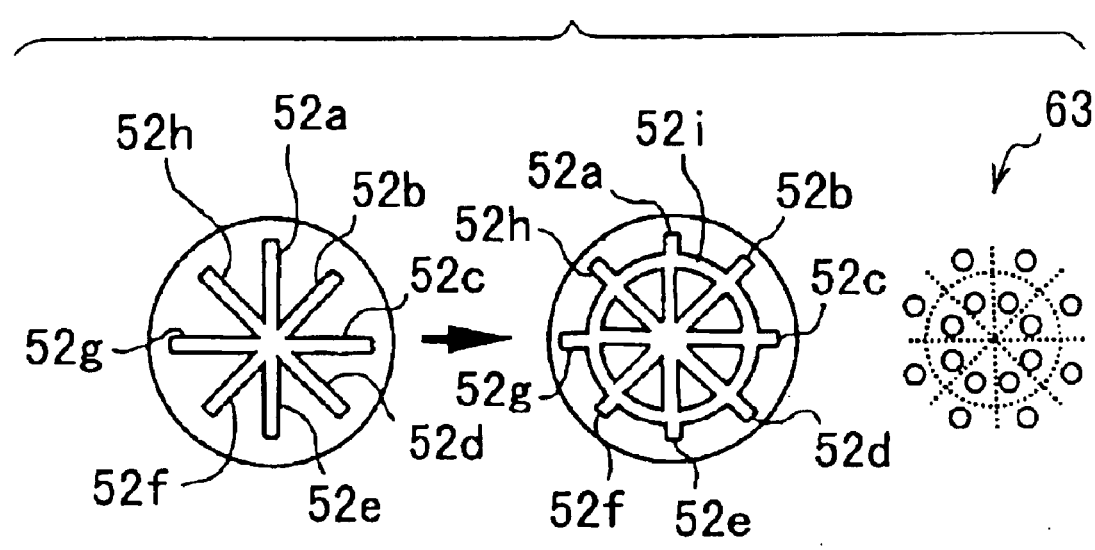
FIG. 11 is a surface processing pattern to show one example of a modification of the surface emitting semiconductor laser made in accordance with the second embodiment of the present invention and an electromagnetic field mode pattern produced by the surface processing pattern.

Then, as shown in FIG. 11, an annular boundary region (loss region) 52i of 9 $\mu$m in diameter was formed inside the electrode aperture, and it was recognized that a mode 63 producing 16 light emitting spots inside and outside the boundary regions was stably produced. Here, the spots shown in FIG. 12 are schematically shown and are not necessarily circular but may be formed in the shape of a fan.

(Third Embodiment)

The third embodiment is a modification of the first embodiment and the second embodiment described above, and is different in the longitudinal (lamination) structure of the substrate from the first and second embodiments. That is, the upper multilayer reflection film is formed of a $Ga_{0.5}In_{0.5}P$ layer 33 in place of the $Al_{0.8}Ga_{0.2}As$ layer. Since the other portions in the present embodiment are the same as those in the first two embodiments, like reference symbols in the first embodiment are assigned to the parts similar or corresponding to those in the first embodiment and their description will be omitted. Here, the $Ga_{0.5}In_{0.5}P$ layer 33 corresponds to the etching preventing layer of the present invention and the method of the present embodiment corresponds to the method of manufacturing the surface emitting semiconductor laser of the twelfth aspect of the present invention.

Figure 12A:
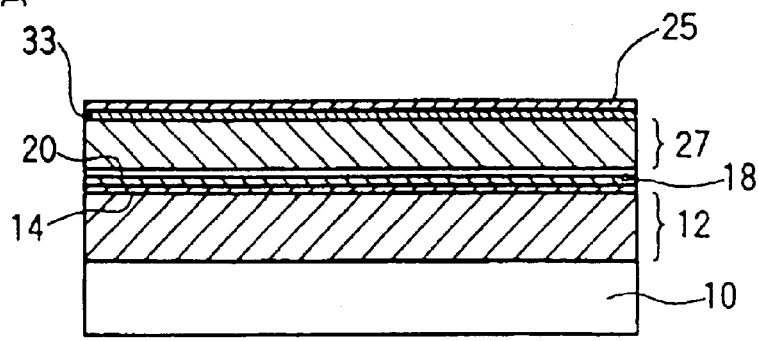
FIGS. 12A to 12H are cross-sectional views to show the first half of the process for manufacturing a surface emitting semiconductor laser made in accordance with the third embodiment of the present invention.
Figure 12B:
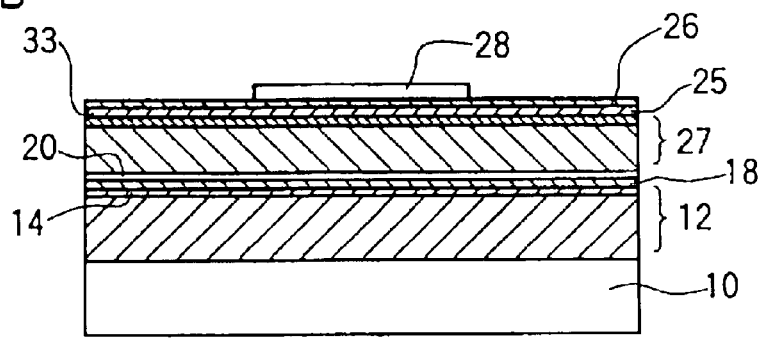
Figure 12C:
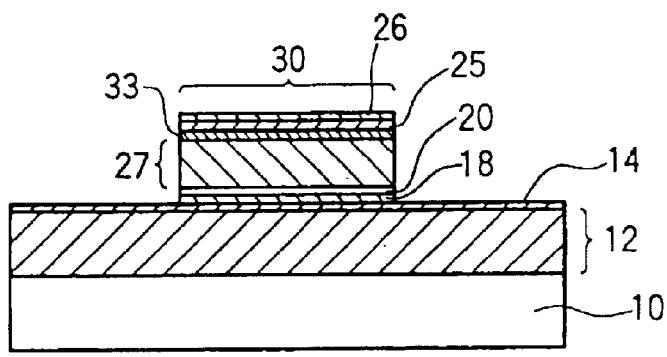
Figure 12D:
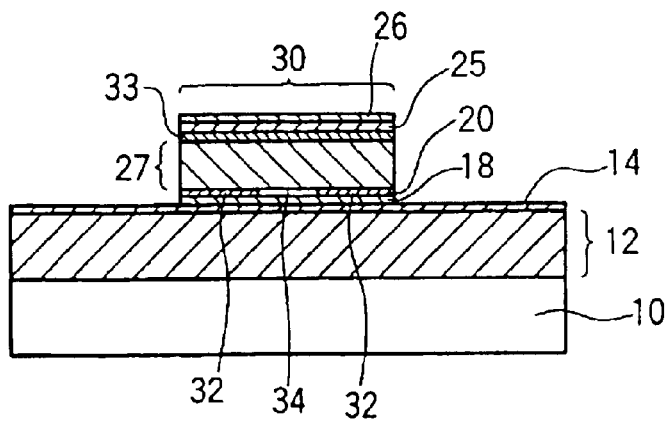
Figure 12E:
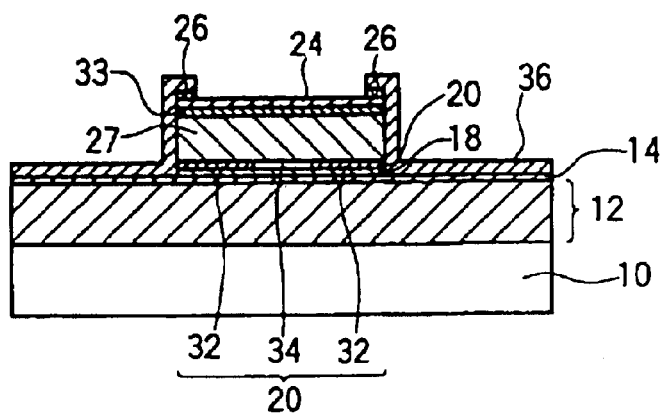
Figure 12F:
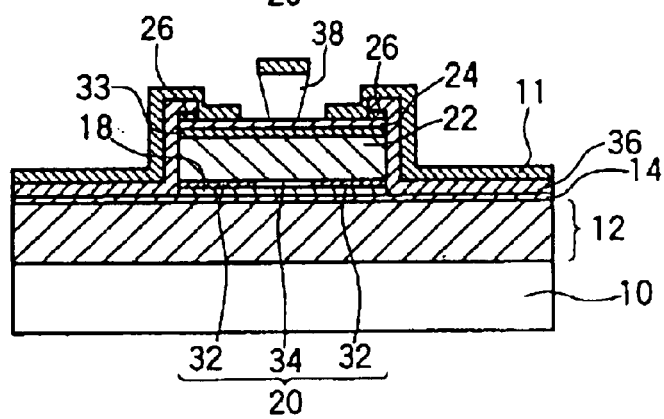
Figure 12G:
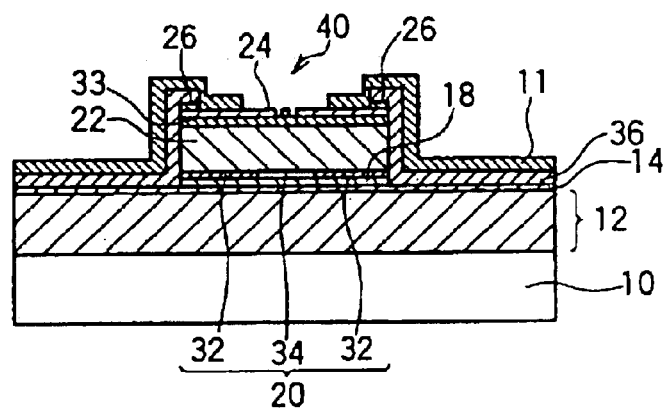
Figure 12H:
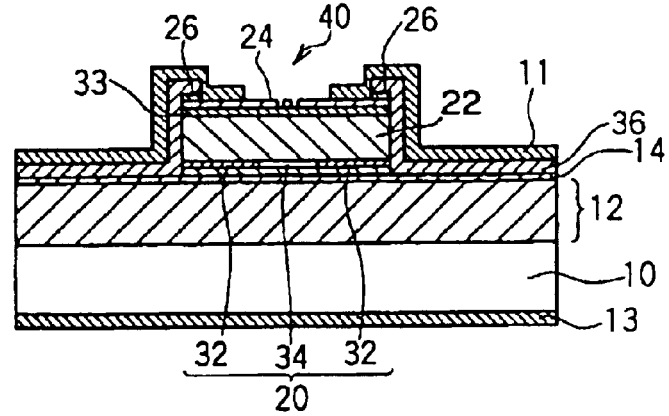
Figure 13:
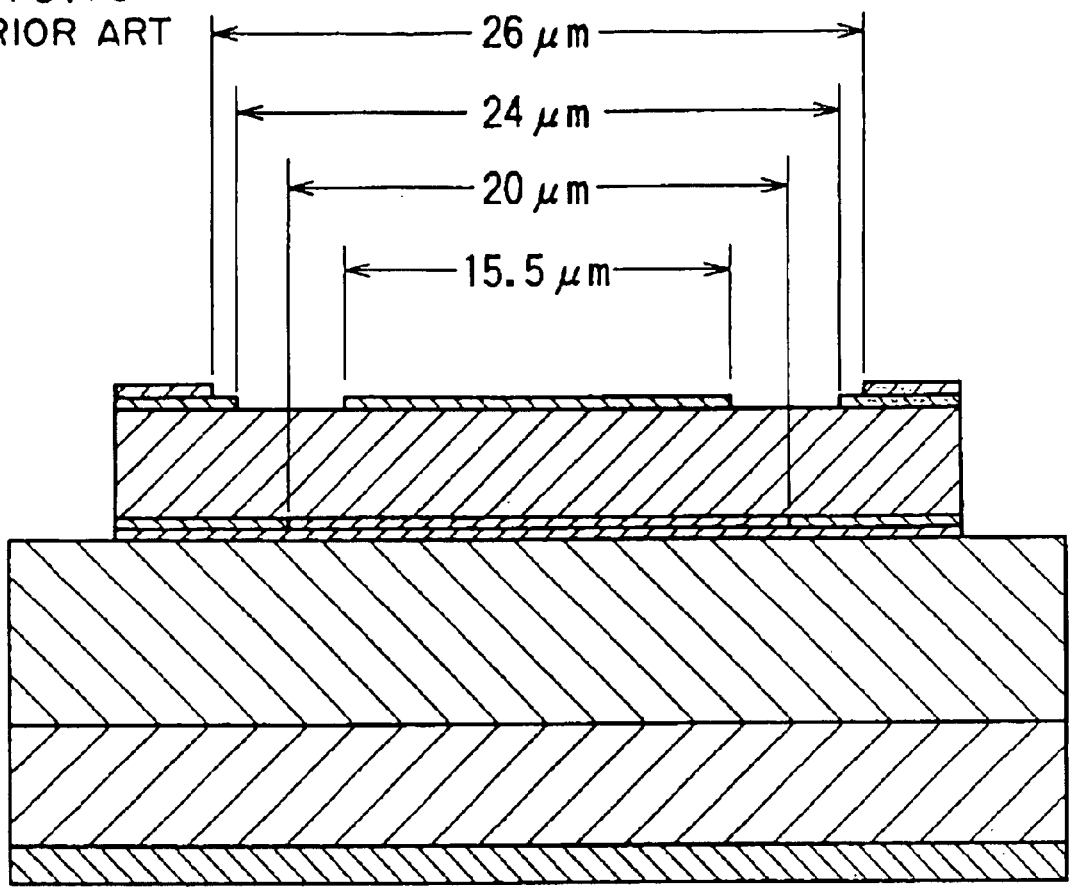
FIG. 13 is a cross-sectional view of a surface emitting semiconductor laser made in accordance with a conventional technology.

In FIG. 12A, a lower multilayer reflection film 12 formed of a plurality of laminated bodies each of which is formed of a pair of n-type $Al_{0.8}Ga_{0.2}As$ layer and n-type $Al_{0.1}Ga_{0.9}As$ layer, a lower spacer layer 14 formed of an undoped $Al_{0.4}Ga_{0.6}As$ layer, a quantum well active layer (not shown) formed of a laminated body of a quantum well layer formed of an undoped GaAs layer and a barrier layer formed of an undoped $Al_{0.2}Ga_{0.8}As$ layer, an upper spacer layer 18 formed of an undoped $A_{0.4}Ga_{0.6}As$ layer, a p-type AlAs layer 20, an upper multilayer reflection film 27 formed of a plurality of laminated bodies each of which is formed of a pair of p-type $Al_{0.8}Ga_{0.2}As$ layer and p-type $Al_{0.1}Ga_{0.9}As$ layer and having a p-type $Ga_{0.5}In_{0.5}P$ layer 33 formed as an uppermost layer, and a contact layer 25 formed of a p-type GaAs layer are laminated in sequence on the (100) surface of an n-type GaAs substrate 10 by the metal organic chemical vapor deposition (MOCVD) method.

The upper multilayer reflection film 27 in the present third embodiment is formed of the plurality of laminates each of which is formed of the pair of p-type $Al_{0.8}Ga_{0.2}As$ layer and p-type $Al_{0.1}Ga_{0.9}As$ layer and having the $Ga_{0.5}In_{0.5}P$ layer 33 formed as the uppermost layer, wherein each layer has a thickness of $\lambda/4nr$ and is made by laminating 22 sets of layers, each having a different composition, in an alternating manner. The number of sets is the sum of the number of the p-type layers described above, the AlAs layers 20 formed as the lowest layer and the $Ga_{0.5}In_{0.5}P$ layer 33 formed as the uppermost layer.

In the present third embodiment, as is the case with the first and second embodiment, an electrode aperture 40 is formed in the top portion of a post portion by the lift off method and then holes or grooves are formed at portions required according to the desired oscillation mode by the use of the reactive ion beam etching (RIBE) method. In this case, since there is a high etching selectivity (>10:1) between the GaAs contact layer 25 and the $Ga_{0.5}In_{0.5}P$ layer 33, it is possible to control the depths of the holes or the grooves with precision.

When removing only the GaAs contact layer in the first and second embodiments, it is necessary to stop the surface processing at the interface between the GaAs contact layer and the $Al_{0.8}Ga_{0.2}As$ layer, and there are cases where the depths of the holes or the grooves are varied, depending on the conditions such as the amount of dose of implanted ions ($Ga^+$ or the like) or an acceleration voltage.

The reactive ion beam etching method is used in the third embodiment and GaAs and $Ga_{0.5}In_{0.5}P$ are close to each other with respect to a lattice constant but very different from each other with respect to material composition. Therefore, the etching selectivity is sufficiently large and thus it is possible to easily stop etching at the interface between the GaAs layer and the $Ga_{0.5}In_{0.5}P$ layer 33. In particular, in the case where the electrode aperture is etched in the shape of grooves, in general, it is difficult to control the depths of the grooves in the portion where the grooves cross each other because the electrode aperture is subjected to a plurality of etching processes. However, the high etching selectivity between the GaAs layer and the $Ga_{0.5}In_{0.5}P$ layer can resolve this problem.

In the three embodiments described above, the surface processing methods are methods utilizing devices for carrying out cutting processes, such as FIB or RIBE. However, the surface processing methods are not limited to these methods, and it is possible to make loss regions on the surface of the portion to be processed, for example, by forming a dielectric film or a metallic film thereon.

In this regard, while the $Ga_{0.5}In_{0.5}P$ layer was formed as an etching preventing layer on the uppermost layer of the upper multilayer reflection film 27 in the third embodiment described above, it is essential that this etching preventing layer is formed of a material capable of preventing etching and the material of the etching preventing layer is not limited to this material, $Ga_{0.5}In_{0.5}P$. In other words, it is essential that the etching preventing layer is formed of a material having a large etching selectivity, typically, exceeding 10:1 for the etching preventing layer with respect to the contact layer 25 formed on the etching preventing layer and is lattice matched to the semiconductor substrate to be used. In the case of the embodiment described above, for example, $(Al_xGa_{1-x})_{0.5}In_{0.5}P$ or ZnSSe-based material satisfies this requirement. Since the material having a large composition ratio of AlInP or ZnSSe has a larger energy band gap than GaInP, it increases transparency to light from the active layer, which is desirable from the viewpoint of energy conversion efficiency. However, in the case of the $(Al_xGa_{1-x})_{0.5}In_{0.5}P$, as the value of x comes near to 1, when it is exposed to the atmosphere, it is oxidized to raise the possibility of degrading its characteristics. Therefore, it is desirable that the value of x is as small as possible, typically, 0.1 or less.

While the upper multilayer reflection film 22 (or 27) was the p type and the lower multilayer reflection film 12 was the n type in the first embodiment to the third embodiment, they are not limited to these but it is thought that they are made opposite in conduction type or that the conduction type of one reflection film is made lower or intrinsic for the purpose of making an intra-cavity type VCSEL. In general, since it is feared that the p-type layer might increase device resistance because of the discontinuity of the energy band as compared with the n-type layer, it is not desirable to increase the number of p-type layers because increasing the number of layers degrades laser characteristics. For this reason, in order to cause light to be emitted from the top surface of the substrate, the conduction type of the upper multilayer reflection film 22 (or 27) was made the p type for the purpose of reducing the number of layers of the upper multilayer reflection film 22 (or 27) as compared with the lower multilayer reflection film 12. However, from an other viewpoint, since the device resistance is inversely proportional to the area, forming the upper multilayer reflection film 22 (or 27) into the shape of the post causes an increase in device resistance. Therefore, it can be also thought that the n type is more preferable than the p type for the upper multilayer reflection film 22 of the same area. In the end, it is recommended that the conduction type is selected from the overall viewpoint, while taking into account the direction of emitting light and a difference in device resistance of the conduction types or compatibility with the driving circuit.

Further, while GaAs was used as a material for constituting the quantum well layer in the first embodiment to the third embodiment, it is not intended to limit the present invention to this material but it is possible to use the other materials such as AlGaAs, InGaAs or GaInNAs.

Still further, while cases where the MOCVD method was used as a method for growing crystals have been described in the first embodiment to the third embodiment, it is not intended to limit the present invention to this method, but it is possible to apply the other methods for producing the same laminated film to the present invention. For example, a molecular beam epitaxy (MBE) method is given as one of the methods.

While the top layer of the upper multilayer reflection film was made as the light emitting layer in the first embodiment to the third embodiment, it is not intended to limit the present invention to this configuration but it is possible to form the light emitting layer having the boundary regions formed therein as the lower layer or the inside layer by controlling the film forming conditions when forming the upper multilayer reflection film.

Still further, while the cases where the surface layer was etched away to form the recesses as the boundary regions have been described in the first embodiment to the third embodiment, it is possible to form the boundary regions by adding films to the regions other than the boundary regions, for example, by forming a plurality of films in the state where a resist pattern is formed on the boundary regions and then removing the resist pattern.

(Fourth Embodiment)

Next, the fourth embodiment will be described in which a far-field pattern (FFP) is made to have a single peak by providing a separate phase lock mechanism to drastically improve the coupling efficiency of high transverse mode to the optical fiber in the VCSEL described in the embodiments described above and having grooves as boundary regions on the surface.

Figure 19:
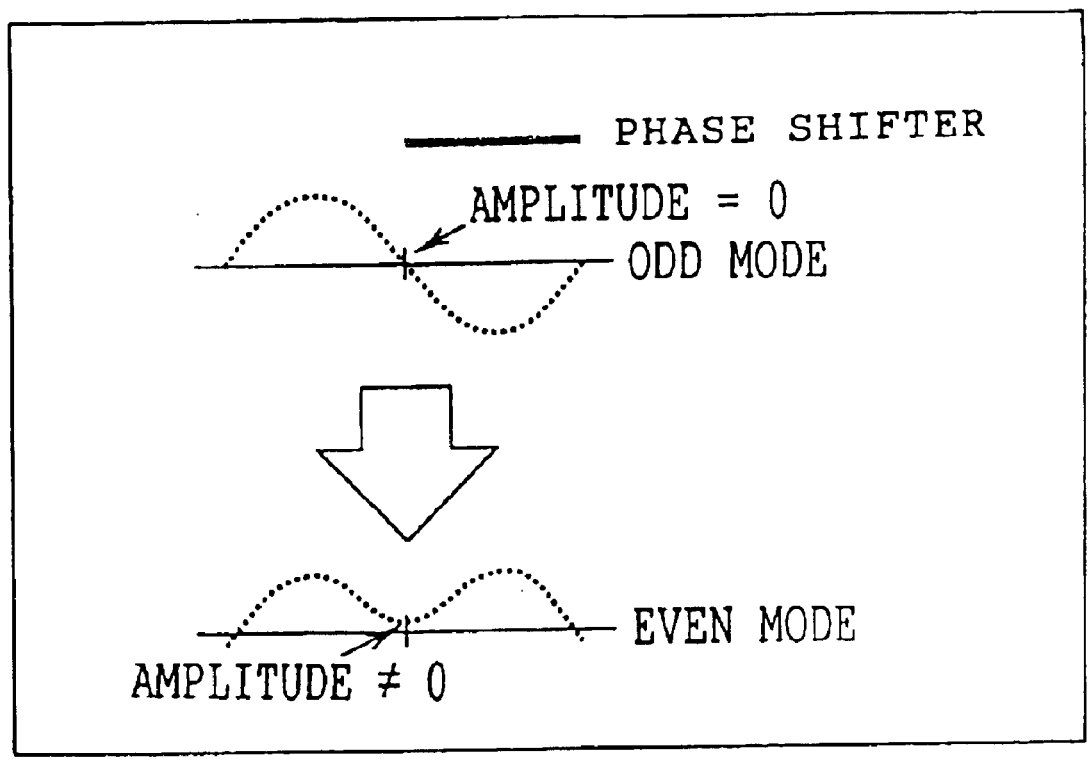
FIG. 19 shows a phase lock mechanism.

First of all, the principle of the phase lock will be described with reference to FIG. 19. A book titled "Semiconductor Laser" authored by Kenichi Iga (published by Ohm Co.) discloses that "If a plurality of light emitting waveguides are formed on the same substrate and the electric field phases of the neighboring waveguides are synchronized with each other to keep a constant phase relation in terms of time and space, it is expected to produce a single peak beam of large output power. Such a device is referred to as a phase synchronized laser array." Further, the book discloses that: "It has been theoretically proven that in the case of an array formed of N waveguides, if coupling is weak, N array modes (referred to as a super mode) exist and if coupling is strong, even if the respective waveguides satisfy the fundamental mode conditions, 2N array modes exist because the primary modes are allowed. Of the N modes, a mode in the state where the phases between the waveguides agree with each other is referred to as a zero degree phase mode and can substantially produce a far-field image having one peak, which is practically desirable. Further, a mode in the state where the difference in phase between the neighboring waveguides is 180 degrees is referred to as a 180 degree phase mode and produces a far-field image having two peaks". Further disclosed is: "An optical field amplitude between the waveguides is zero in the case of the 180 degree phase mode, whereas in the case of the zero degree phase mode, it is not zero and a threshold gain is increased because of loss in the regions between the waveguides. Therefore, the 180 degree phase mode is easier to oscillate."

It is thought that in the light emission of the VCSEL producing the high order mode oscillation, the photoelectric field phases of the light emitting spots are shifted from each other by 180 degrees, so the FFP shows two peaks. Therefore, as shown in FIG. 19, it is thought that if the phase of one light emitting spot is shifted by the use of a phase shifter to reverse the phase by 180 degrees, the FFP of one peak can be produced as is the case with the zero degree phase mode.

Although the devices fabricated in the first embodiment through the third embodiment produce the high order transverse mode oscillation, they do not show the multimode oscillation characteristics usually produced but rather the single mode oscillation characteristics and they are apt to produce the FFP having two peaks and efficiency of coupling with the optical is not very high. Therefore, in the present embodiment, the surface of the device described above is partially etched away by a predetermined film thickness to produce a phase shift of 180 degrees ($\pi$) between the light emitting spot at the portion etched away and the light emitting portion at a portion which is adjacent to this portion and not etched away.

Figure 14A:
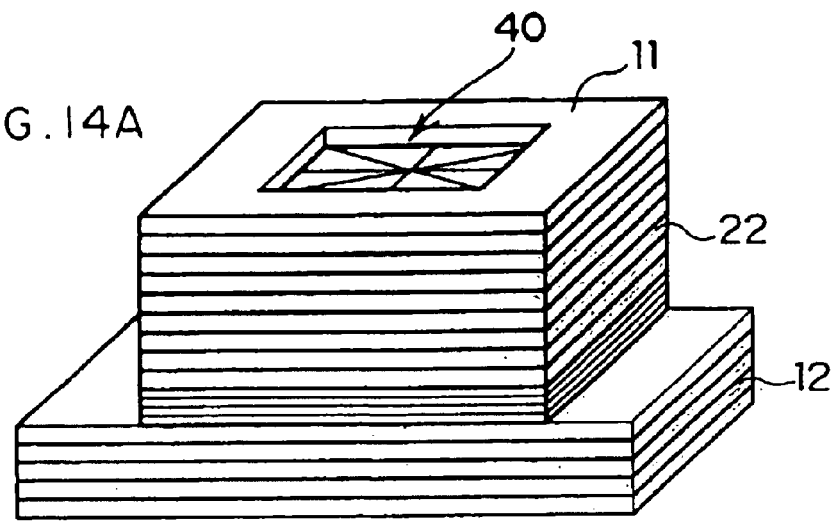
FIG. 14A is an external view of a device made in accordance with the fourth embodiment.
Figure 14B:
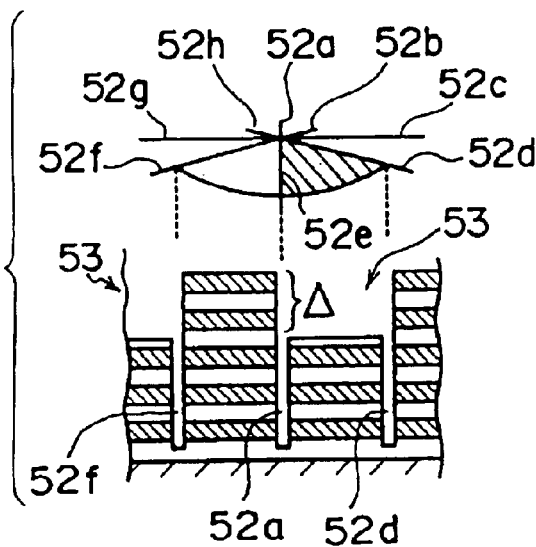
FIG. 14B is a cross-sectional schematic view of a portion, etched away by FIB, of the device made in accordance with the fourth embodiment.
Figure 14C:
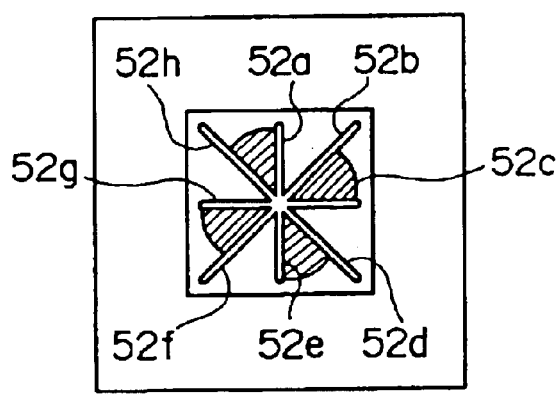
FIG. 14c is a plan view of the light emitting portion of the device made in accordance with the fourth embodiment.

FIG. 14A shows an external view of a device in accordance with the present embodiment. FIG. 14B shows a cross-sectional schematic view of a portion of the device which is etched away by a depth of $\Delta$ by the FIB method. FIG. 14C shows a plan view of a light emitting portion. Here, in FIGS. 14A to 14C, parts corresponding to those in FIGS. 2A to 2H are denoted by the same reference numbers and their description will be omitted.

In the present embodiment, by etching away the divided regions divided by the plurality of stripe grooves 52a to 52h and arranged in the circumferential direction in an alternating manner, that is, on every other region, recesses 53 are formed as the phase shift regions having a depth of $\Delta$ in the etched-away portions.

The device shown in FIGS. 14a to 14C oscillates at the $LP_{41}$ mode and the principle described below holds true for the devices oscillating at the other modes. In the oscillation of the $LP_{41}$ mode, the light emitting spot regions are divided into 8 regions by the plurality of stripe grooves 52a to 52h which form the plurality of divided regions and the phase is stably shifted by $\pi$ between the divided regions for producing two light emitting spots adjacent in the circumferential direction.

In the present embodiment, the surfaces of alternate fan-shaped divided regions for producing the light emitting spots are removed by etching the upper multilayer reflection film 22 using the FIB to the middle portion thereof to a depth of about 0.2 $\lambda$m. The depth of $\Delta$ is determined by calculating an optical path length so that the phase of the light emitting spot in the region etched away is shifted by $\pi$ with respect to the light emitting spot of the region which is not etched away and thus remains. Here, the depth was determined to remove one pair of contact layer 24 having a film thickness of 40 nm and uppermost layer of the upper multilayer reflection film 22.

Figure 15:
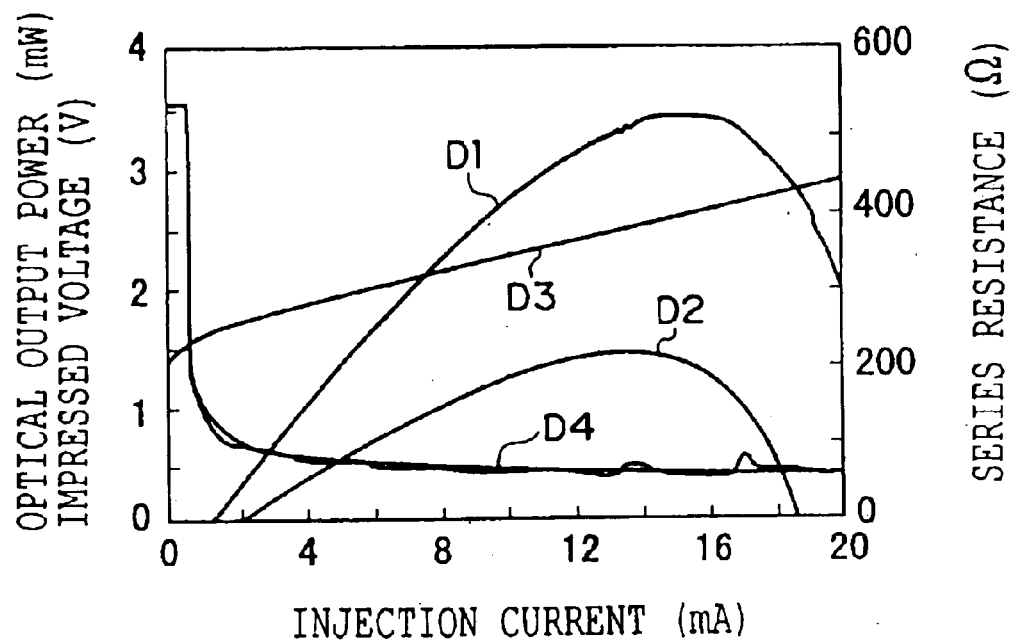
FIG. 15 is a graph to show the L-I-V characteristics of the fourth embodiment.

The L-I-V characteristics of the device produced in this manner is shown in FIG. 15, which shows the I-L characteristics D1 of the device in which eight grooves expanding radially are only formed in the boundary regions of the mode to produce the single high order mode, and the I-L characteristics D2 of the device that has eight grooves expanding radially and formed in the boundary regions of the mode and further is subjected to the etching process described above to shift the phase by $\pi$ to lock the phase. The optical output power of the phase-locked device is reduced by nearly half but V-I characteristics D3 is not changed much, which reveals that the device maintains low resistance. Further, also I-R characteristics D4 shows little change. Also the reduction in the optical output power is ascribable to the impaired flatness of the surface of the device, caused by etching using the FIB, and this problem can be solved by using a method of maintaining the flatness of the surface such as the selective etching method.

Figure 16:
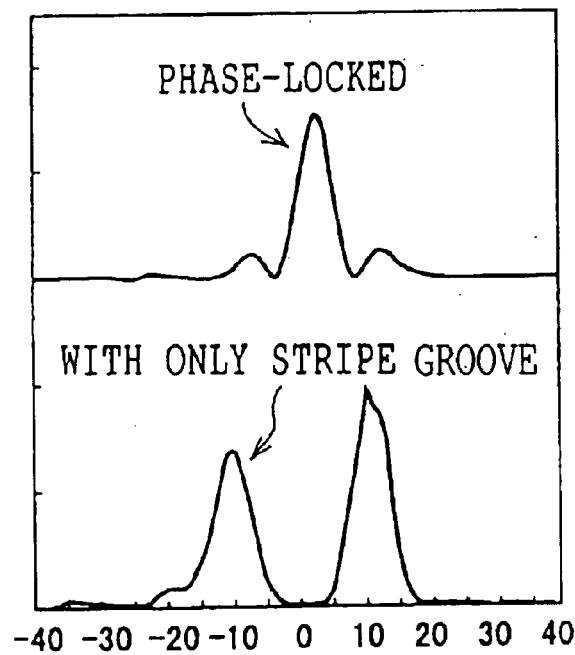
FIG. 16 is a graph to show a comparison of the FFP of the device having only stripe grooves and the FFP of the phase-locked device.

Next, the FFPs of both devices are shown in FIG. 16. As is evident from FIG. 16, the device having only stripe grooves shows the FFP having two peaks, as described above, whereas the device which is phase-locked by shifting the phase by $\pi$ has a high intensity ratio and a drastically improved broadening angle of 5 degrees, shown by full width at half of the maximum, though it has sub-peaks near the main peak. This can drastically improve the efficiency of coupling with the optical fiber.

While a method for removing the semiconductor multilayer film by etching to produce the phase shift has been described in the fourth embodiment, it is not intended to limit the present invention to this method, but it is possible to produce the same effects by forming a phase shift layer, for example, by laminating dielectric films or metallic films on the surface.

(Fifth Embodiment)

In the fourth embodiment described above, the example has been described in which in the VCSEL having stripe grooves formed on the surface of the device so as to produce the specific high order oscillation mode, the FFP was made to substantially have a single peak by forming the phase shift regions (recesses) in the specific regions to drastically improve the coupling efficiency to the optical fiber.

However, it was found that this method produced the effect of causing the high order oscillation mode to be the single oscillation mode to a certain extent also in the device not having the grooves, so the fifth embodiment in which the present invention is applied to the device not having the grooves will be described in the following.

The manufacturing method in accordance with the fifth embodiment is to partially etch away the surface of the fan-shaped divided regions of the device by a predetermined film thickness to shift the phase by $\pi$, as is the case with the fourth embodiment, without using the process for forming the boundary regions such as grooves or the like used in first embodiment through the fourth embodiment.

Figure 17A:
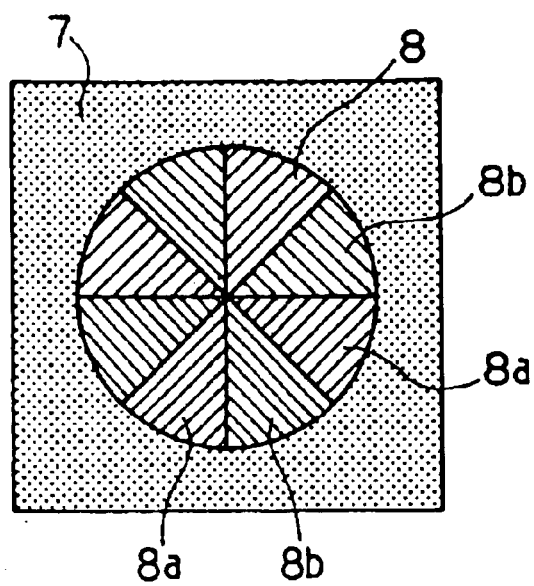
FIG. 17A is a plan view of a device made in accordance with the fifth embodiment.
Figure 17B:
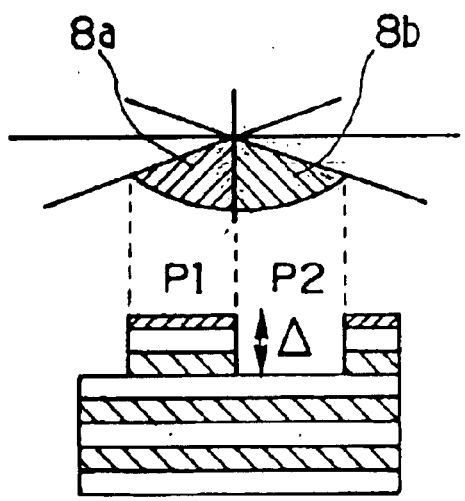
FIG. 17B is a cross-sectional schematic view of a portion, etched away, of the device made in accordance with the fifth embodiment.

FIG. 17A is a plan view to schematically show the plane of the device. FIG. 17B is a schematic cross-sectional view of the portion etched away. In FIG. 17A, a reference character 7 denotes a current confinement portion and a reference character 8 denotes an aperture that is a light emitting region.

While the planar shape of the phase shift layer is determined in the present embodiment in consideration of the $LP_{41}$ mode oscillation, as is the case with the fourth embodiment described above, the principle described below holds true for the other modes. The light emitting region 8 is divided into a plurality of divided regions according to the specific oscillation mode. In FIGS. 17A and 17B, the light emitting region 8 is divided into eight divided regions and in the fan-shaped spot regions 8a and 8b which are alternately arranged as the divided regions, the contact layer and part of the upper DBR layer of each spot region 8b are etched away by the use of the RIE to a depth of $\Delta$ that shifts the phase of the light emitting spot by $\pi$ to make a recess to thereby form a stepped shape between the spot regions 8a and 8b.

In the case where such stepped shapes are formed, the flat portion substantially maintains an initial state and thus maintains a high reflectivity (referred to as a high reflectivity region P1) so that there is little effect on the oscillation characteristics. However, since the interface portion (boundary region) corresponding to the step becomes a transition region from the high reflectivity region P1 to a high reflectivity region P2 equal to the region P1, the reflectivity is reduced and optical loss is inevitably caused by diffraction and dispersion in the vicinity of the interface. Therefore, the interface portions described above function as the grooves formed at the same portions in the first embodiment through the fourth embodiment and are apt to produce a standing wave having nodes at these portions.

Therefore, this can lock the phase and produce a mode selectivity and thus produce a high order single mode. However, the effect of suppressing the other modes is weak, as compared with the device with the grooves.

However, as a result of the phase lock produced by the π phase shift, the broadening angle of the FFP is as narrow as 5 degrees and thus the coupling efficiency with the optical fiber is increased sufficiently, and a method for facilitating a decrease in reflectivity of the transition region from the high reflectivity region P1 to the high reflectivity region P2 or widening the width of the transition region is thought of as a measure for further improving the mode selectivity. To this end, as shown in FIGS. 20A to 20D, it is effective to form the stepped portion in the shape of a normal taper or a reverse taper.

The interface portion (boundary region) corresponding to the stepped portion is the transition region from the high reflectivity region P1 to the high reflectivity region P2 which has a reflectivity equal to the region P1, and hence is regarded as a singular point which is not consistent with the film thickness conditions necessary for maintaining a high reflectivity. The shape of taper plays a roll in emphasizing this and is apt to produce the diffraction or dispersion of the incident light, thereby inevitably reducing the reflectivity.

Even in the case of using an etching process technology, in particular, a dry etching technology (reactive ion etching technology or the like), the root portion of the stepped portion is a singular point region where a phenomenon of deep gouging caused by the rebounded ions is often observed, depending on the process conditions. FIG. 20D shows a cavity or a gouged dip which is formed by the use of this phenomenon and is extended in the depth direction from the stepped portion. This gouged dip is used for controlling the transverse mode because the reflectivity is remarkably decreased at the gouged dip.

Figure 18:
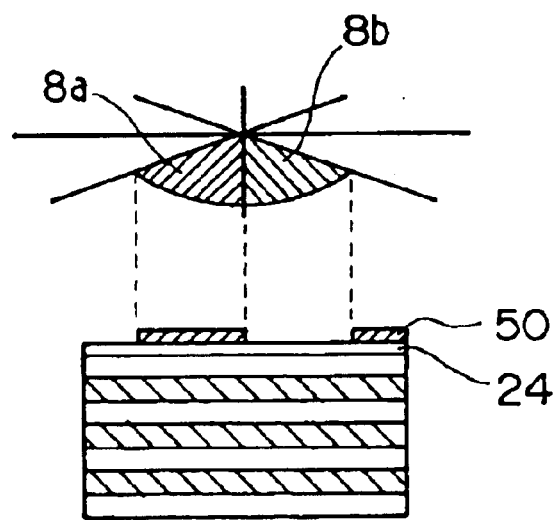
FIG. 18 is a cross-sectional view of a device having a phase shift layer made by laminated layers.

While the method for forming the recesses by etching away the semiconductor multilayer film so as to produce the phase shift has been described in the fifth embodiment, it is not intended to limit the present invention to this method, and it is possible to produce the same effect, for example, by forming at least one of the dielectric film, the semiconductor film and the transparent metallic film on the surface of the device to form an projection. FIG. 18 shows an example of a device in which a phase shift layer 50 is laminated on the contact layer by continuously growing a semiconductor and then both the layers are subjected to a selective etching to form a region having a phase shift effect. In this case, it is possible to combine the contact layer 24 made of GaInP with the phase shift layer 50 made of GaAs. Further, the phase shift layer of the laminated layer type is not necessarily a single layer but may be a multilayer film made of GaAs and AlGaAs, as is the case with the DBR mirror. This holds true for the case using the dielectric film, the semiconductor film, or the transparent metallic film. While the example of emitting light from the top portion of the post of the substrate has been described in the embodiment described above, it is clear that the substrate may be removed by the lift off method or the like and light may be emitted from the removed side.

In the surface emitting semiconductor laser manufactured by the processes described above, the function of confining the current and light is performed by the regions selectively oxidized, whereas the control of the oscillation mode is performed by the surface pattern formed in the electrode aperture. In this manner, the VCSEL of the reflectivity waveguide type is realized which has a low threshold current, a high efficiency and a high speed response and further excellent characteristics of high output power and low resistance, and still further a stable transverse mode, which is the essential object of the present invention.

Finally, it is not intended to limit the present invention to the embodiments described above, and needless to say, the present invention can be realized by the other methods if the methods satisfy the configurational requirements of the present invention.

What is claimed is:

1. A surface emitting semiconductor laser which is equipped with a resonator and includes a first reflection layer in which a single light emitting region is formed, an active layer and a second reflection layer formed so as to sandwich the active layer between the first reflection layer and itself, wherein the single light emitting region includes:
   a boundary region for suppressing the light emission of oscillation modes except for a specific oscillation mode, the boundary region introducing an optical loss; and
   a plurality of divided regions which are substantially divided by the boundary region to produce a light emitting spot corresponding to the specific oscillation mode.

2. A surface emitting semiconductor laser according to claim 1, wherein the boundary region is a recess formed in a part of a surface layer which forms a light emitting surface of the light emitting region.

3. A surface emitting semiconductor laser according to claim 1, wherein the boundary region is a projection formed at a part of a surface layer which forms a light emitting surface of the light emitting region.

4. A surface emitting semiconductor laser according to claim 2, wherein the recess is one or more holes.

5. A surface emitting semiconductor laser according to claim 2, wherein the recess is a groove.

6. A surface emitting semiconductor laser according to claim 1, wherein the size of the light emitting region is large enough to permit emission of light of the specific oscillation mode.

7. A surface emitting semiconductor laser according to claim 1, wherein a reflectivity of the resonator in the boundary region is smaller than a reflectivity of the resonator in the divided region.

8. A surface emitting semiconductor laser according to claim 1, further comprising a current confinement layer that is oxidized so as to have a non-oxidation region corresponding to the amount of current injected necessary for emitting light of the specific oscillation mode provided between the first reflection layer and the active layer.

9. A surface emitting semiconductor laser according to claim 1, wherein the oscillation mode is a linearly polarized mode and wherein the specific oscillation mode is a linearly polarized mode of one or more orders.

10. A surface emitting semiconductor laser according to claim 2, wherein a layer adjacent to the surface layer is an etching preventing layer made of a material for preventing etching.

11. A surface emitting semiconductor laser according to claim 1, wherein a media of the surface layers which form light emitting surfaces of neighboring divided regions have different refractive indices so that the light emitting spots emitted from the neighboring divided regions have the same phase.

12. A surface emitting semiconductor laser according to claim 11, wherein the cross sections of the plurality of divided regions are alternately formed in the shape of a recess and in the shape of a projection.

13. A surface emitting semiconductor laser according to claim 12, wherein when the cross section is formed in the shape of a recess, the shape of the recess is formed by etching and when the cross section is formed in the shape of a projection, the shape of the projection is formed by laminating at least one of a dielectric film, a semiconductor film and a transparent metallic film.

14. A surface emitting semiconductor laser which is equipped with a resonator and includes a first reflection layer in which a light emitting region is formed, an active layer and a second reflection layer formed so as to sandwich the active layer between the first reflection layer and itself, wherein the light emitting region includes a plurality of divided regions for producing light emitting spots corresponding to a specific oscillation mode and wherein the media of the surface layers which form the light emitting surfaces of neighboring divided regions have different refractive indices so that the light emitting spots emitted from the neighboring divided regions have the same phase.

15. A surface emitting semiconductor laser according to claim 14, wherein the boundary region of the neighboring divided regions of the plurality of divided regions suppresses light emission of oscillation modes except for the specific oscillation mode.

16. A surface emitting semiconductor laser according to claim 14, wherein the cross sections of the plurality of divided regions are alternately formed in the shape of a recess and in the shape of a projection.

17. A surface emitting semiconductor laser according to claim 16, wherein when the cross section is formed in the shape of a recess, the shape of the recess is formed by etching and when the cross section is formed in the shape of a projection, the shape of the projection is formed by laminating at least one of a dielectric film, a semiconductor film and a transparent metallic film.

18. A surface emitting semiconductor laser according to claim 15, wherein the boundary region is a stepped portion when cross sections of the plurality of divided regions are alternately formed in the shape of a recess and in the shape of a projection.

19. A surface emitting semiconductor laser according to claim 18, wherein the stepped portion is tapered.

20. A surface emitting semiconductor laser according to claim 19, wherein a dip extending in the direction of depth from the stepped portion is formed so as to emphasize the stepped portion formed in the boundary region between the neighboring divided regions.

21. A surface emitting semiconductor laser according to claim 20, wherein when the cross section is formed in the shape of a recess by etching, the dip is formed at the same time when the recess is formed.

22. The surface emitting semiconductor laser of claim 1, wherein a media of the surface layers which form light emitting surfaces of neighboring divided regions have different refractive indices.

23. The surface emitting semiconductor of claim 2, wherein the surface layer is a contact layer.

* * * * *